(12) United States Patent
Nam

(10) Patent No.: US 11,323,110 B2
(45) Date of Patent: May 3, 2022

(54) DUTY TIMING DETECTOR DETECTING DUTY TIMING OF TOGGLE SIGNAL, DEVICE INCLUDING DUTY TIMING DETECTOR, AND OPERATING METHOD OF DEVICE RECEIVING TOGGLE SIGNAL

(71) Applicant: SAMSUNG ELECTRONICS CO., LTD., Suwon-si (KR)

(72) Inventor: Hyunseok Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/079,579

(22) Filed: Oct. 26, 2020

(65) Prior Publication Data

US 2021/0044284 A1 Feb. 11, 2021

Related U.S. Application Data

(63) Continuation of application No. 16/506,311, filed on Jul. 9, 2019, now Pat. No. 10,819,327.

(30) Foreign Application Priority Data

Oct. 29, 2018 (KR) .................. 10-2018-0129928

(51) Int. Cl.
*H03K 5/156* (2006.01)
*H02M 3/158* (2006.01)
(Continued)

(52) U.S. Cl.
CPC ........ *H03K 5/1565* (2013.01); *H02M 3/1582* (2013.01); *H03K 4/08* (2013.01);
(Continued)

(58) Field of Classification Search
CPC combination set(s) only.
See application file for complete search history.

(56) References Cited

U.S. PATENT DOCUMENTS 4,536,700 A 8/1985 Bello et al.
7,190,150 B2 3/2007 Chen et al.
(Continued)

FOREIGN PATENT DOCUMENTS

CN 102624231 A 8/2012

OTHER PUBLICATIONS

"On-Chip Digital Inductor Current Sensor for Monolithic Digitally Controlled DC-DC Converter", Man Pun Chan, Student Member, IEEE, and Philip K. T. Mok, Senior Member, IEEE, IEEE Transactions on Circuits and Systems—I: Regular Papers, vol. 60, No. 5, May 2013.
(Continued)

*Primary Examiner* — Long Nguyen
(74) *Attorney, Agent, or Firm* — Volentine, Whitt & Francos, PLLC

(57) ABSTRACT

A duty timing detector includes a saw-tooth voltage generator that outputs a saw-tooth voltage in synchronization with a toggle signal repeatedly transitioning between a high level and a low level. A sample block obtains a level of the saw-tooth voltage in synchronization with the toggle signal and outputs the obtained level as a first sample voltage. A hold block stores the first sample voltage in synchronization with the toggle signal and outputs the stored first sample voltage as a second sample voltage. A voltage divider divides the second sample voltage to output a division voltage. A comparator compares the saw-tooth voltage and the division voltage to detect a target timing in each duty of the toggle signal.

20 Claims, 22 Drawing Sheets

(51) Int. Cl.
*H03K 5/06* (2006.01)
*H03K 7/08* (2006.01)
*H03K 4/08* (2006.01)
*H03K 5/08* (2006.01)

(52) U.S. Cl.
CPC .............. *H03K 5/06* (2013.01); *H03K 5/082* (2013.01); *H03K 7/08* (2013.01)

(56) References Cited

U.S. PATENT DOCUMENTS

| | | |
|---|---|---|
| 7,719,251 B2 | 5/2010 | Qahouq et al. |
| 8,330,437 B1 * | 12/2012 | Hartman ............. H02M 3/1588 |
| | | 323/271 |
| 8,363,363 B2 | 1/2013 | Isham |
| 9,000,345 B2 | 4/2015 | Liu et al. |
| 9,231,476 B2 | 1/2016 | Diewald et al. |
| 10,819,327 B2 * | 10/2020 | Nam ....................... H03K 5/082 |
| 2011/0290987 A1 | 12/2011 | Liu et al. |
| 2013/0320946 A1 | 12/2013 | Luo et al. |
| 2018/0131357 A1 | 5/2018 | Geiss |

OTHER PUBLICATIONS

"Design and Implementation of Fully Integrated Digitally Controlled Current-Mode Buck Converter", Man Pun Chan, Student Member, IEEE, and Philip K. T. Mok, Senior Member, IEEE, IEEE Transactions on Circuits and Systems—I: Regular Papers, vol. 58, No. 8, Aug. 2011.

\* cited by examiner

DUTY TIMING DETECTOR DETECTING DUTY TIMING OF TOGGLE SIGNAL, DEVICE INCLUDING DUTY TIMING DETECTOR, AND OPERATING METHOD OF DEVICE RECEIVING TOGGLE SIGNAL

CROSS-REFERENCE TO RELATED APPLICATIONS

This is a Continuation of U.S. application Ser. No. 16/506,311, filed Jul. 9, 2019, issued as U.S. Pat. No. 10,819,327 on Oct. 27, 2020, and a claim of priority under 35 U.S.C. § 119 is made to Korean Patent Application No. 10-2018-0129928 filed on Oct. 29, 2018, in the Korean Intellectual Property Office, the disclosure of which is incorporated by reference herein in its entirety.

BACKGROUND

Embodiments of the disclosure described herein relate to an electronic device, and more particularly, relate to a duty timing detector detecting a duty timing of a toggle signal, a device including the duty timing detector, and an operating method of a device receiving the toggle signal.

A toggle signal is a signal which repeats a high-to-low transition and a low-to-high transition. The toggle signal is used variously in electronic devices. For example, the toggle signal may be used to indicate an accurate timing as a clock signal or a strobe signal. For another example, the toggle signal may be used to control an operation of a device, which receives the toggle signal, such as a pulse width modulation (PWM) control.

One of devices which use the toggle signal as a control signal may be a DC (Direct Current)-DC converter. The DC-DC converter is configured to step up or step down an input voltage. The DC-DC converter may adjust the amount of output current by using the toggle signal, depending on the amount of current consumed by a load.

When the toggle signal is used as an operation control signal, detecting whether a current timing of the toggle signal is a target timing is helpful to monitor a status of a device which uses or receives the toggle signal. However, until now, there is no device or method developed to detect a timing of the toggle signal.

SUMMARY

Embodiments of the disclosure provide a duty timing detector detecting a duty timing of a toggle signal, a device including the duty timing detector, and an operating method of a device receiving the toggle signal.

According to an exemplary embodiment, a duty timing detector includes a saw-tooth voltage generator that outputs a saw-tooth voltage in synchronization with a toggle signal repeatedly transitioning between a high level and a low level. A sample block obtains a level of the saw-tooth voltage in synchronization with the toggle signal and outputs the obtained level as a first sample voltage. A hold block stores the first sample voltage in synchronization with the toggle signal and outputs the stored first sample voltage as a second sample voltage. A voltage divider divides the second sample voltage to output a division voltage. A comparator compares the saw-tooth voltage and the division voltage to detect a target timing in each duty of the toggle signal According to an exemplary embodiment, a device includes a voltage converter that converts a first voltage to a second voltage, by using a toggle signal repeatedly transitioning between a high level and a low level, and outputs the second voltage to a load. A current detector detects a load current transferred from the voltage converter to the load. The current detector may include a duty timing detector that activates a detection voltage at a timing when a half of each duty of the toggle signal passes. A voltage drop detector detects an internal voltage drop of the voltage converter in response to the detection voltage. Logic obtains the load current by performing calculation on the internal voltage drop detected by the voltage drop detector.

According to an exemplary embodiment, an operating method of a device which receives a toggle signal repeatedly transitioning between a high level and a low level includes: (1) generating a saw-tooth voltage in synchronization with the toggle signal, (2) obtaining a level of the saw-tooth voltage in synchronization with the toggle signal, (3) dividing the level of the saw-tooth voltage to obtain a division voltage, and (4) comparing the saw-tooth voltage and the division voltage to detect a target timing in each duty of the toggle signal.

According to an exemplary embodiment, a waveform timing device includes a timing circuit that generates a first voltage whose value is proportional to a first on-time of a waveform applied to the timing circuit during a first cycle of the waveform comprising the first on-time and a first off-time. A comparator compares the first voltage with a reference signal, generated from a second cycle of the waveform, to generate a timing signal indicating whether a predetermined portion of a second on-time of the second cycle of the waveform has expired.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
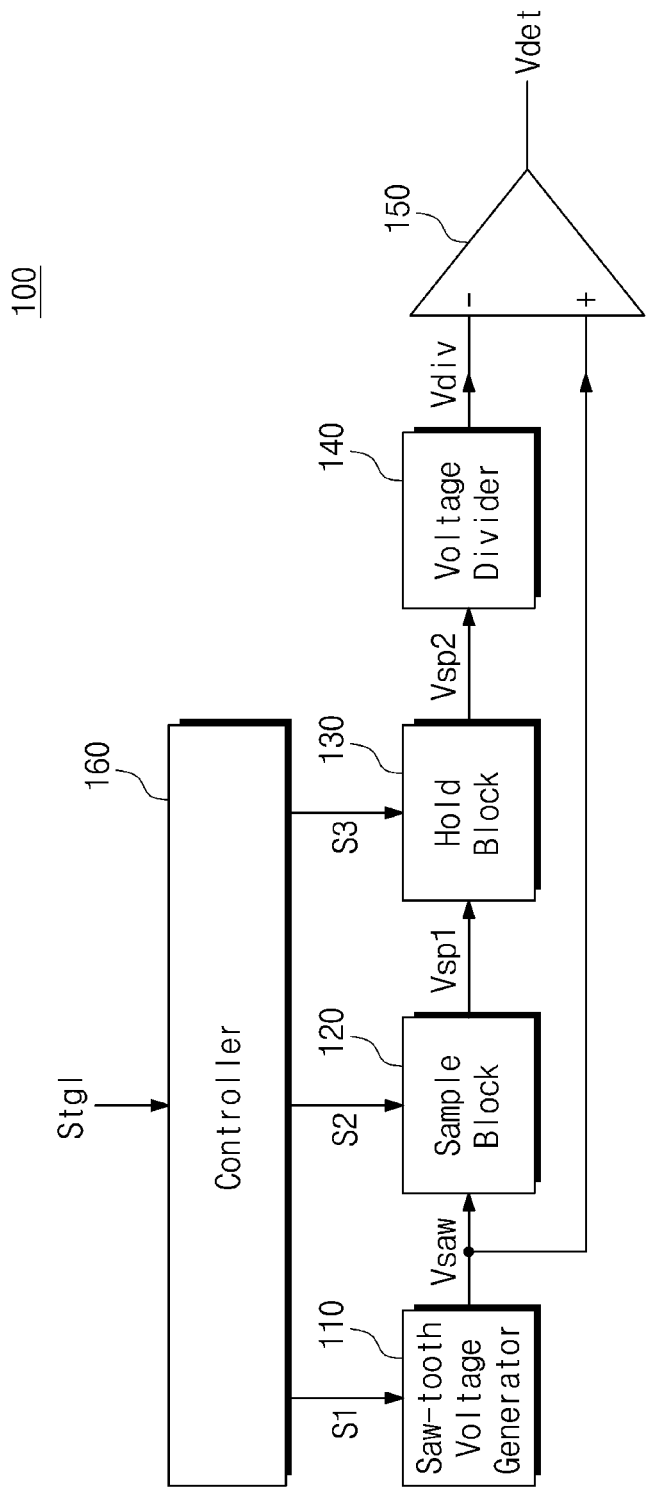
FIG. 1 is a block diagram illustrating a duty timing detector according to an embodiment of the disclosure.

FIG. 1 is a block diagram illustrating a duty timing detector 100 according to an embodiment of the disclosure. The duty timing detector 100 may detect a particular timing (e.g., a target timing) on a duty from a toggle signal which repeats a high-to-low transition and a low-to-high transition (or repeatedly transitions between a high level and a low level). The duty may indicate a duration in which the toggle signal has a high level (or a low level). A duty ratio may indicate a ratio of a high-level (or low-level) duration of the toggle signal to one period.

Referring to FIG. 1, the duty timing detector 100 includes a saw-tooth voltage generator 110, a sample block 120, a hold block 130, a voltage divider 140, a comparator 150, and a controller 160.

The saw-tooth voltage generator 110 is configured to generate a saw-tooth voltage Vsaw in response to a first signal S1 from the controller 160. The saw-tooth voltage Vsaw may have an idle interval in which a ground level is maintained, and a saw-tooth interval in which a level continuously increases from the ground level. The saw-tooth voltage Vsaw is provided to the sample block 120 and the comparator 150.

The sample block 120 may receive the saw-tooth voltage Vsaw from the saw-tooth voltage generator 110. The sample block 120 may obtain (e.g., sample or store) a level of the saw-tooth voltage Vsaw in response to a second signal S2 from the controller 160. The obtained level may be output as a first sample voltage Vsp1.

The hold block 130 may receive the first sample voltage Vsp1 from the sample block 120. The hold block 130 may store (e.g., hold) a level of the first sample voltage Vsp1 in response to a third signal S3 from the controller 160. The stored level may be output as a second sample voltage Vsp2.

The voltage divider 140 may receive the second sample voltage Vsp2 from the hold block 130. The voltage divider 140 may divide the second sample voltage Vsp2 depending on a particular division ratio. The voltage divider 140 may output a division voltage Vdiv as a result of the division.

The comparator 150 may receive the division voltage Vdiv through a negative input. The comparator 150 may receive the saw-tooth voltage Vsaw through a positive input. When the saw-tooth voltage Vsaw is lower than the division voltage Vdiv, the comparator 150 may output a detection voltage Vdet of the low level. When the saw-tooth voltage Vsaw is not lower than the division voltage Vdiv, the comparator 150 may output the detection voltage Vdet of the high level.

The detection voltage Vdet may indicate whether a timing on a duty of a toggle signal Stgl reaches a target timing. The target timing may be determined depending on the division ratio of the voltage divider 140. Also, the detection voltage Vdet may have a duty which is determined by dividing the duty of the toggle signal Stgl by the division ratio of the voltage divider 140.

The controller 160 may receive the toggle signal Stgl. The controller 160 may generate the first signal S1, the second signal S2, and the third signal S3 in synchronization with the toggle signal Stgl. That is, the saw-tooth voltage generator 110 may generate the saw-tooth voltage Vsaw in synchronization with the toggle signal Stgl. The saw-tooth voltage Vsaw may transition between the idle interval and the saw-tooth interval in synchronization with transition timings of the toggle signal Stgl.

Also, the sample block 120 and the hold block 130 may respectively store the first sample voltage Vsp1 and the second sample voltage Vsp2 in synchronization with the toggle signal Stgl. The first and second sample voltages Vsp1 and Vsp2 may be stored in synchronization with toggle timings of the toggle signal Stgl.

The duty timing detector 100 according to an embodiment of the disclosure may detect the target timing on the duty of the toggle signal Stgl. Accordingly, a device which may verify whether the toggle signal Stgl is being normally generated is provided. Also, the duty timing detector 100 may generate the detection voltage Vdet having a duty which is obtained by dividing the duty of the toggle signal Stgl. A duty dividing function of the duty timing detector 100 may be usefully adopted in various fields.

Figure 2:
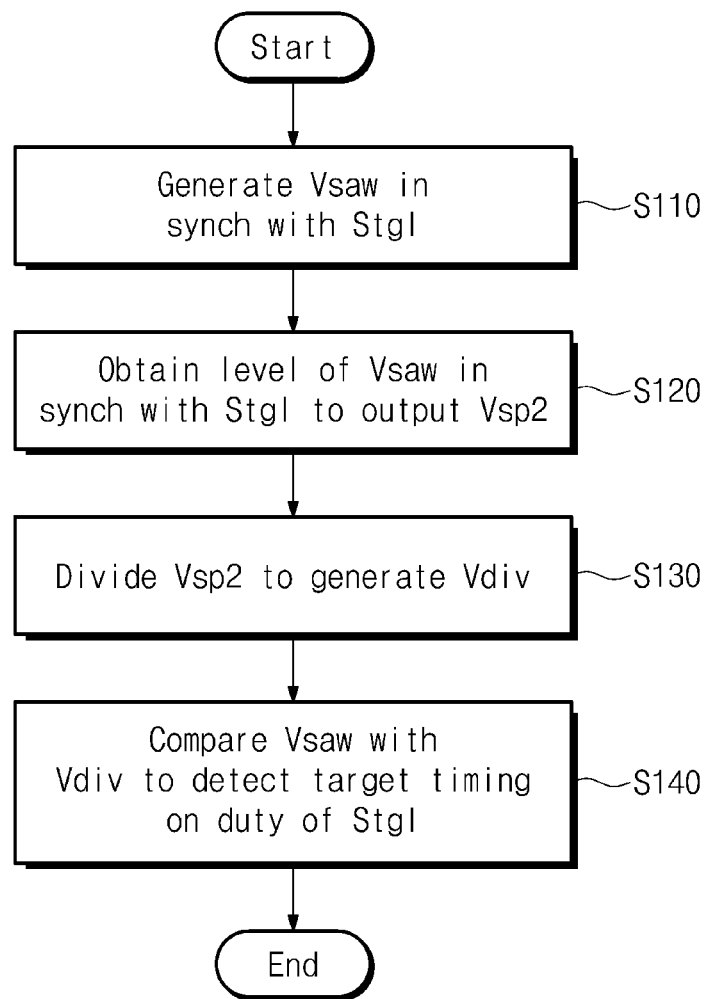
FIG. 2 is a flowchart illustrating an operating method of the duty timing detector according to an embodiment of the disclosure.

FIG. 2 is a flowchart illustrating an operating method of the duty timing detector 100 according to an embodiment of the disclosure. Referring to FIGS. 1 and 2, in operation S110, the saw-tooth voltage generator 110 may generate the saw-tooth voltage Vsaw in synchronization with the toggle signal Stgl. In operation S120, in synchronization with the toggle signal Stgl, the sample block 120 and the hold block 130 may obtain a level of the saw-tooth voltage Vsaw to output a sample voltage (e.g., Vsp2).

In operation S130, the voltage divider 140 may divide the sample voltage (e.g., Vsp2) to generate the division voltage Vdiv. In operation S140, the comparator 150 may compare the saw-tooth voltage Vsaw and the division voltage Vdiv to detect a target timing on a duty of the toggle signal Stgl. A location or a time point of the target timing may be adjusted depending on a division ratio.

Figure 3:
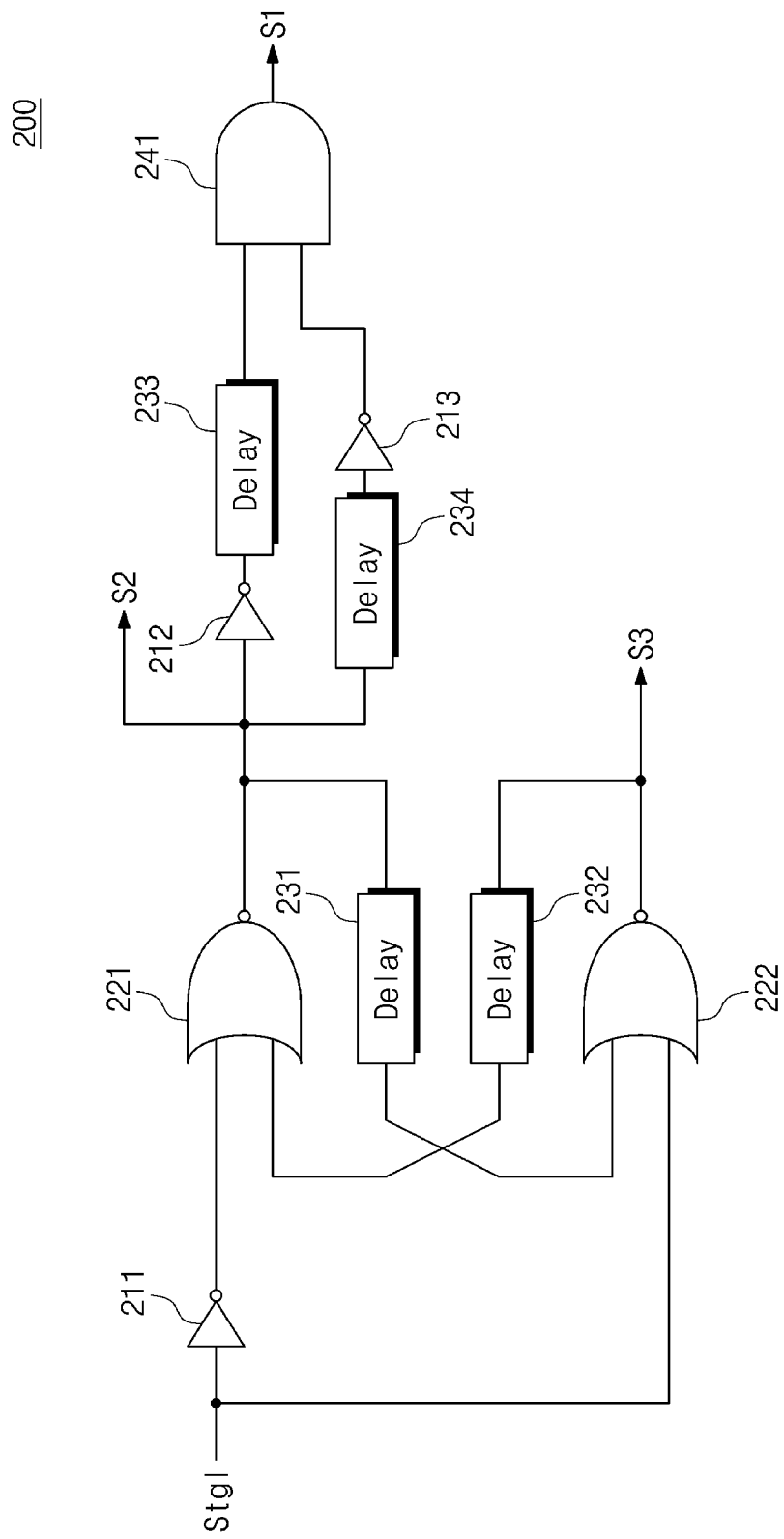
FIG. 3 illustrates a controller according to an embodiment of the disclosure.

FIG. 3 illustrates a controller 200 according to an embodiment of the disclosure. In an embodiment, the controller 200 may be included in the controller 160 described with reference to FIG. 1. Referring to FIGS. 1 and 3, the controller 200 includes first to third inverters 211, 212, and 213, first and second NOR blocks 221 and 222, first to fourth delays 231, 232, 233, and 234, and an AND block 241.

The first inverter 211 may receive the toggle signal Stgl and may invert and output the toggle signal Stgl. The output of the first inverter 211 may be input to an input of the first NOR block 221. The first NOR block 221 may perform a NOR operation on the output of the first inverter 211 and an output of the second delay 232. The second NOR block 222 may perform a NOR operation on the toggle signal Stgl and an output of the first delay 231.

The first delay 231 may delay an output of the first NOR block 221 and may output a result of the delay to the second NOR block 222. The second delay 232 may delay an output of the second NOR block 222 and may output the delayed output to the first NOR block 221. The output of the first NOR block 221 may be used as the second signal S2. The output of the second NOR block 222 may be used as the third signal S3.

The second inverter 212 may invert and output the output (e.g., the second signal S2) of the first NOR block 221. The third delay 233 may delay an output of the second inverter 212 and may output the delayed output to the AND block 241. The fourth delay 234 may delay and output the output (e.g., the second signal S2) of the first NOR block 221. The third inverter 213 may invert an output of the fourth delay 234 and may output a result of the inversion to the AND block 241.

The AND block 241 may perform an AND operation on an output of the third delay 233 and an output of the third inverter 213. An output of the AND block 241 may be used as the first signal S1.

Figure 4:
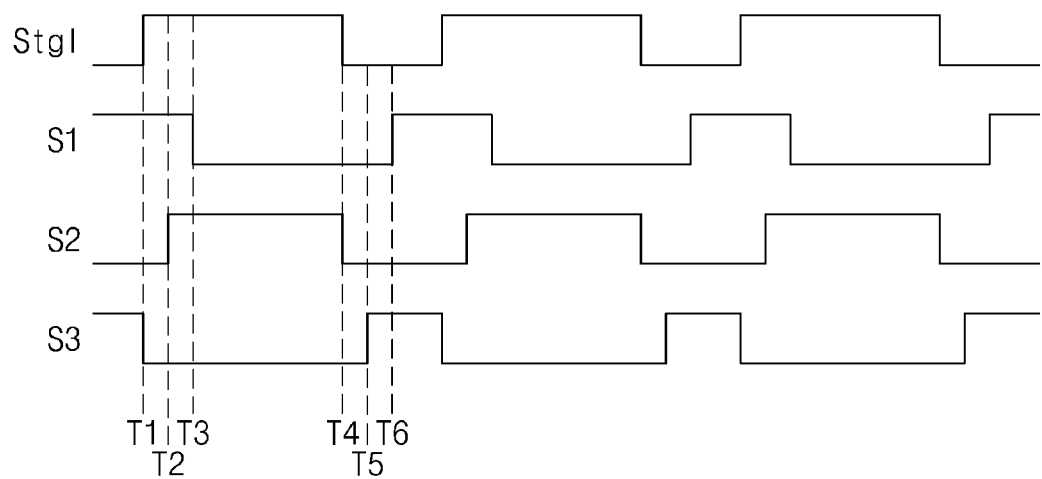
FIG. 4 illustrates an example of timings when a controller according to an embodiment of the disclosure generates a first signal, a second signal, and a third signal from a toggle signal.

FIG. 4 illustrates an example of timings when the controller 200 according to an embodiment of the disclosure generates the first signal S1, the second signal S2, and the third signal S3 from the toggle signal Stgl. Referring to FIGS. 3 and 4, at a first time T1, the toggle signal Stgl may transition from the low level to the high level.

Likewise, at the first time T1, the third signal S3 may transition from the high level to the low level in synchronization with the transition of the toggle signal Stgl. After the toggle signal Stgl and the third signal S3 transition, at a second time T2, the second signal S2 may transition from the low level to the high level in synchronization with the transition of the toggle signal Stgl (e.g., the transition at the first time T1). After the second signal S2 transitions, at a third time T3, the first signal S1 may transition from the high level to the low level in synchronization with the transition of the toggle signal Stgl (e.g., the transition at the first time T1).

At a fourth time T4, the toggle signal Stgl may transition from the high level to the low level. Likewise, at the first time T4, the second signal S2 may transition from the high level to the low level in synchronization with the transition of the toggle signal Stgl. After the toggle signal Stgl and the second signal S2 transition, at a fifth time T5, the third signal S3 may transition from the low level to the high level in synchronization with the transition of the toggle signal Stgl (e.g., the transition at the fourth time T4). After the third signal S3 transitions, at a sixth time T6, the first signal S1 may transition from the low level to the high level in synchronization with the transition of the toggle signal Stgl (e.g., the transition at the fourth time T4).

Afterwards, when the toggle signal Stgl transitions from the low level to the high level, the first to third signals S1 to S3 may sequentially transition as described with reference to the first to third times T1 to T3. When the toggle signal Stgl transitions from the high level to the low level, the first to third signals S1 to S3 may sequentially transition as described with reference to the fourth to sixth times T4 to T6.

An interval between timings when the first to third signals S1 to S3 transition may be a dead time. The dead time may make it possible to prevent an abnormal operation or a current leakage which occurs when transistors in the sawtooth voltage generator 110, the sample block 120, and the hold block 130, to which the first signal S1, the second signal S2, and the third signal S3 are respectively applied, are turned on at the same time.

For clarity of description, the dead time is exaggeratedly expressed in FIG. 4. Actually, the dead time may correspond to a small interval (or a short time interval) to such an extent as to ignore compared with a period or a duty of the toggle signal Stgl.

Figure 5:
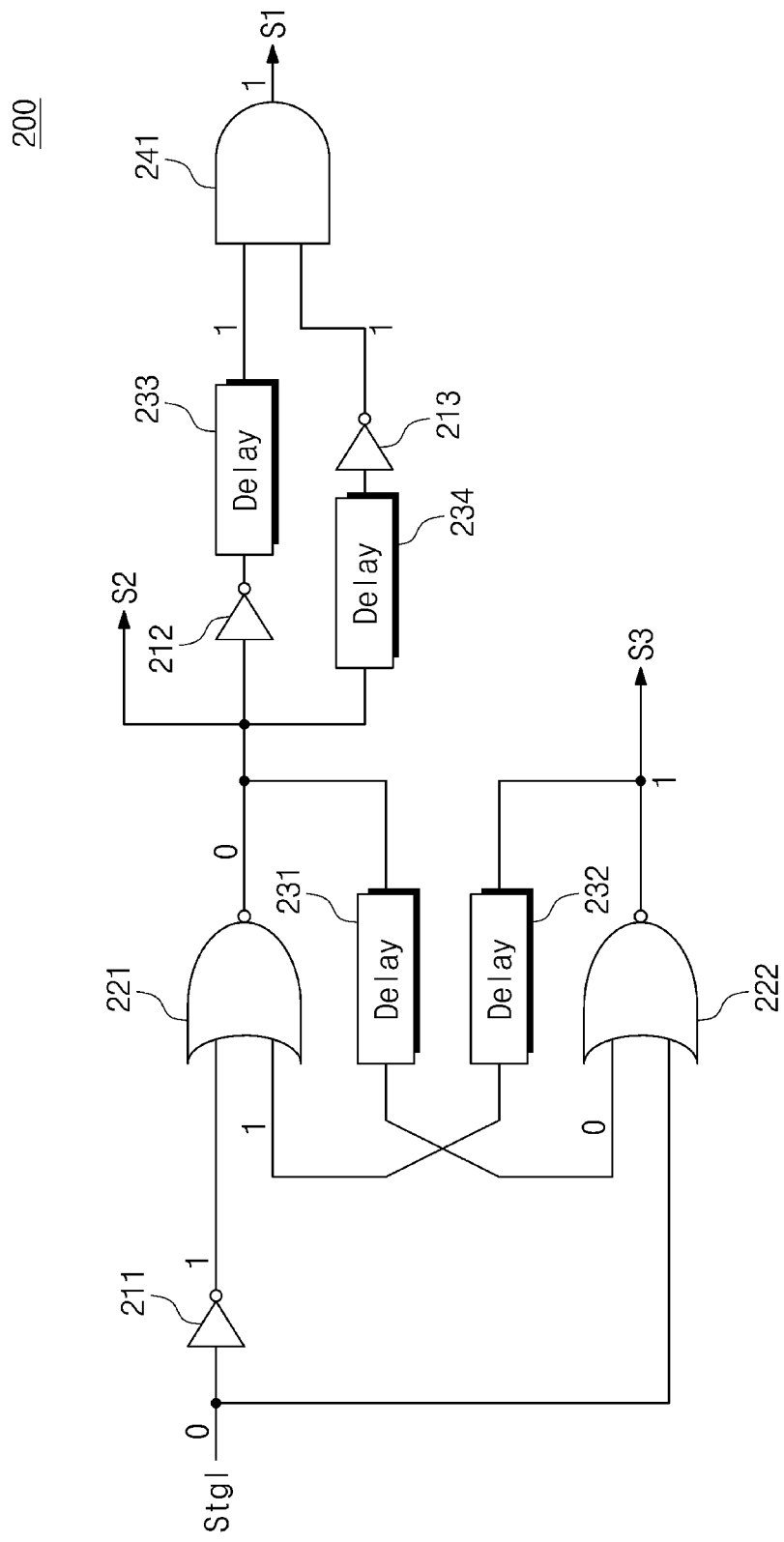
FIG. 5 illustrates an initial state of a controller of FIG. 3, before a first time of FIG. 4.

FIG. 5 illustrates an initial state of the controller 200 of FIG. 3, before the first time T1 of FIG. 4. Referring to FIGS. 4 and 5, the toggle signal Stgl may be at the low level (0), and the first inverter 211 may output the high level (1). The third signal S3 may be at the high level (1), and an output of the delay 232 may be at the same high level as the third signal S3. Since the high levels (1, 1) are input to the first NOR block 221, an output of the first NOR block 221, that is, the second signal S2 may be at the low level (0).

The first delay 231 may output the same low level (0) as the second signal S2. Since the low levels (0, 0) are input to the second NOR block 222, an output of the second NOR block 222, that is, the third signal S3 may be at the high level (1).

An output of the second inverter 212 may be at the high level, and an output of the third delay 233 may be at the high level (1). An output of the fourth delay 234 may be at the low level, and an output of the third inverter 213 may be at the high level (1). Since the high levels (1, 1) are input to the AND block 241, an output of the AND block 241, that is, the first signal S1 may be at the high level (1).

As described above, the controller 200 may be stabilized to a state where the first signal S1 is at the high level (1), the second signal S2 is at the low level (0), and the third signal S3 is at the high level (1).

Figure 6:
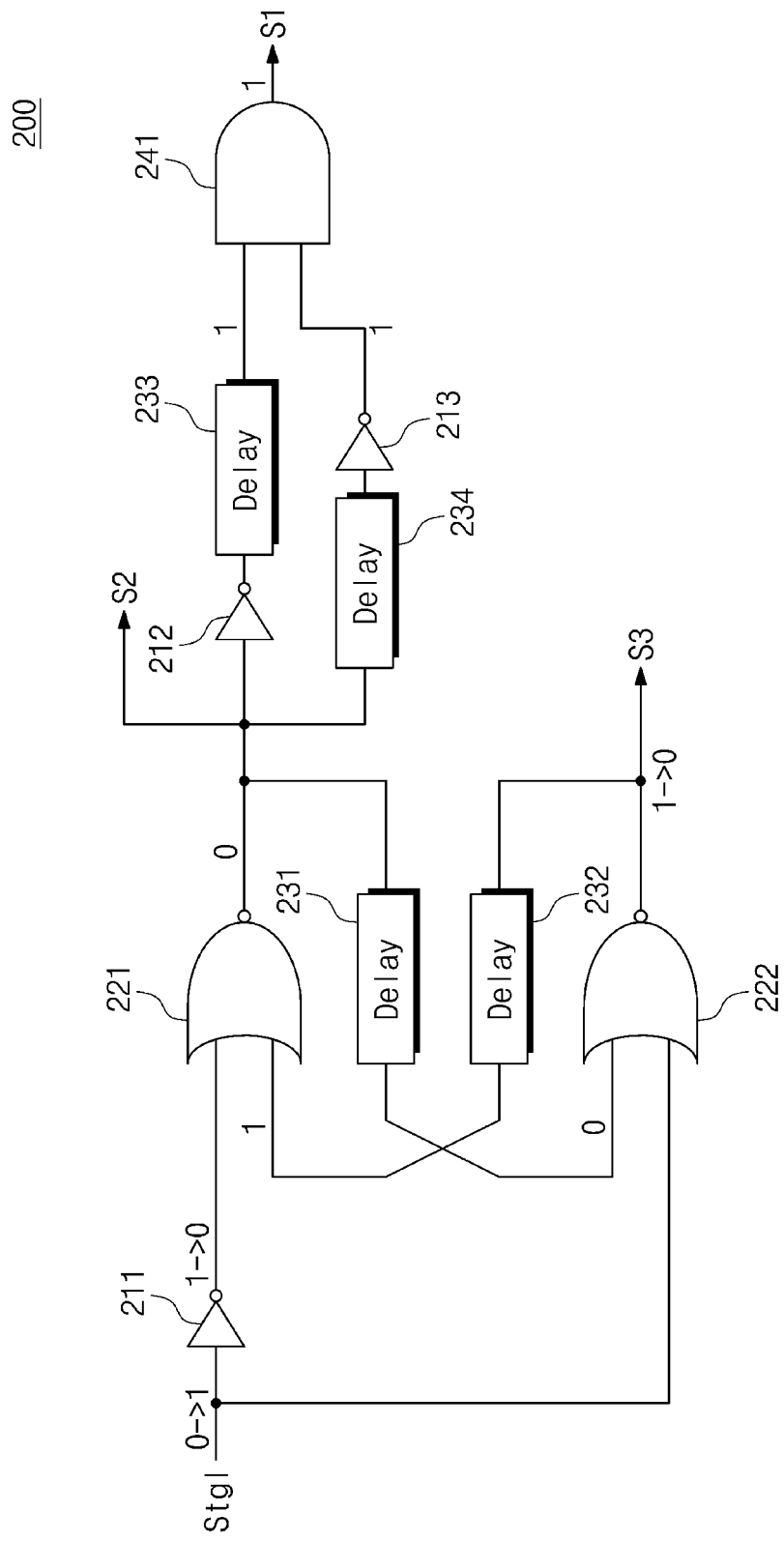
FIG. 6 illustrates logic levels of a controller of FIG. 3, which are changed at a first time of FIG. 4.

FIG. 6 illustrates logic levels of the controller 200 of FIG. 3, which are changed at the first time T1 of FIG. 4. Referring to FIGS. 4 and 6, the toggle signal Stgl may transition from the low level (0) to the high level (1). As the toggle signal Stgl transitions, an output of the first inverter 211 may transition from the high level (1) to the low level (0). Even though the output of the first inverter 211 transitions to the low level (0), an output of the first NOR block 221 may be maintained at the low level (0).

Likewise, since the low level (0) and the high level (1) are input to the second NOR block 222 as the toggle signal Stgl transitions, an output of the second NOR block 222, that is, the third signal S3 may transition from the high level (1) to the low level (0).

Due to the first to fourth delays 231 to 234, the transition of the toggle signal Stgl may not be yet applied to the first signal S1 and the second signal S2. That is, the dead time is defined by the first to fourth delays 231 to 234.

Figure 7:
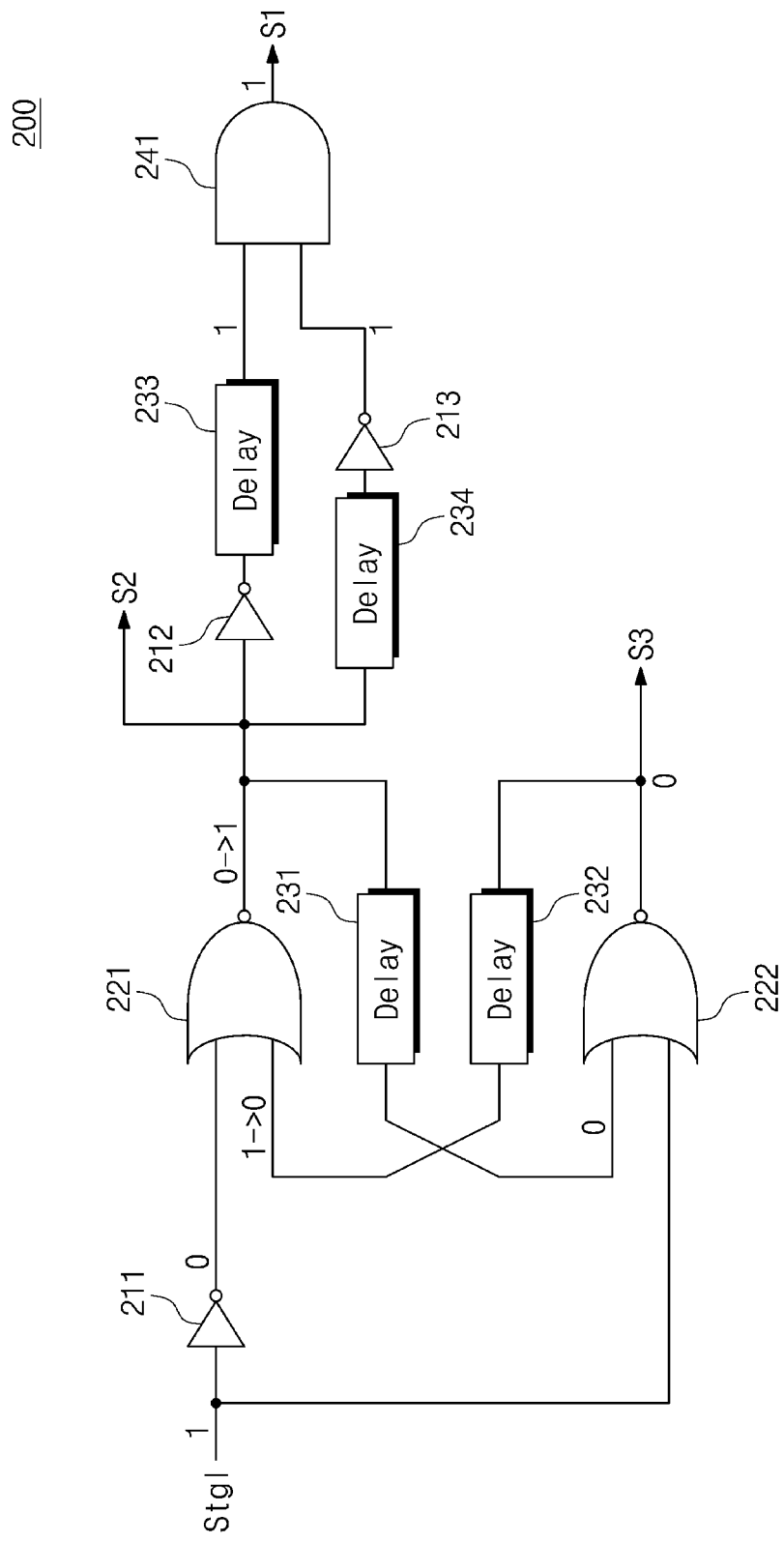
FIG. 7 illustrates logic levels of a controller of FIG. 3, which are changed at a second time of FIG. 4.

FIG. 7 illustrates logic levels of the controller 200 of FIG. 3, which are changed at the second time T2 of FIG. 4. Referring to FIGS. 4 and 7, an output of the second delay 232 may transition from the high level (1) to the low level (0) as the transition of the output of the second NOR block 222, that is, the transition of the third signal S3 is applied.

Since the low levels (0, 0) are input to the first NOR block 221, an output of the first NOR block 221, that is, the second signal S2 may transition from the low level (0) to the high level (1). Due to the third and fourth delays 233 and 234, the transition of the toggle signal Stgl may not be yet applied to the first signal S1. That is, an additional dead time is defined by the third and fourth delays 233 and 234.

Figure 8:
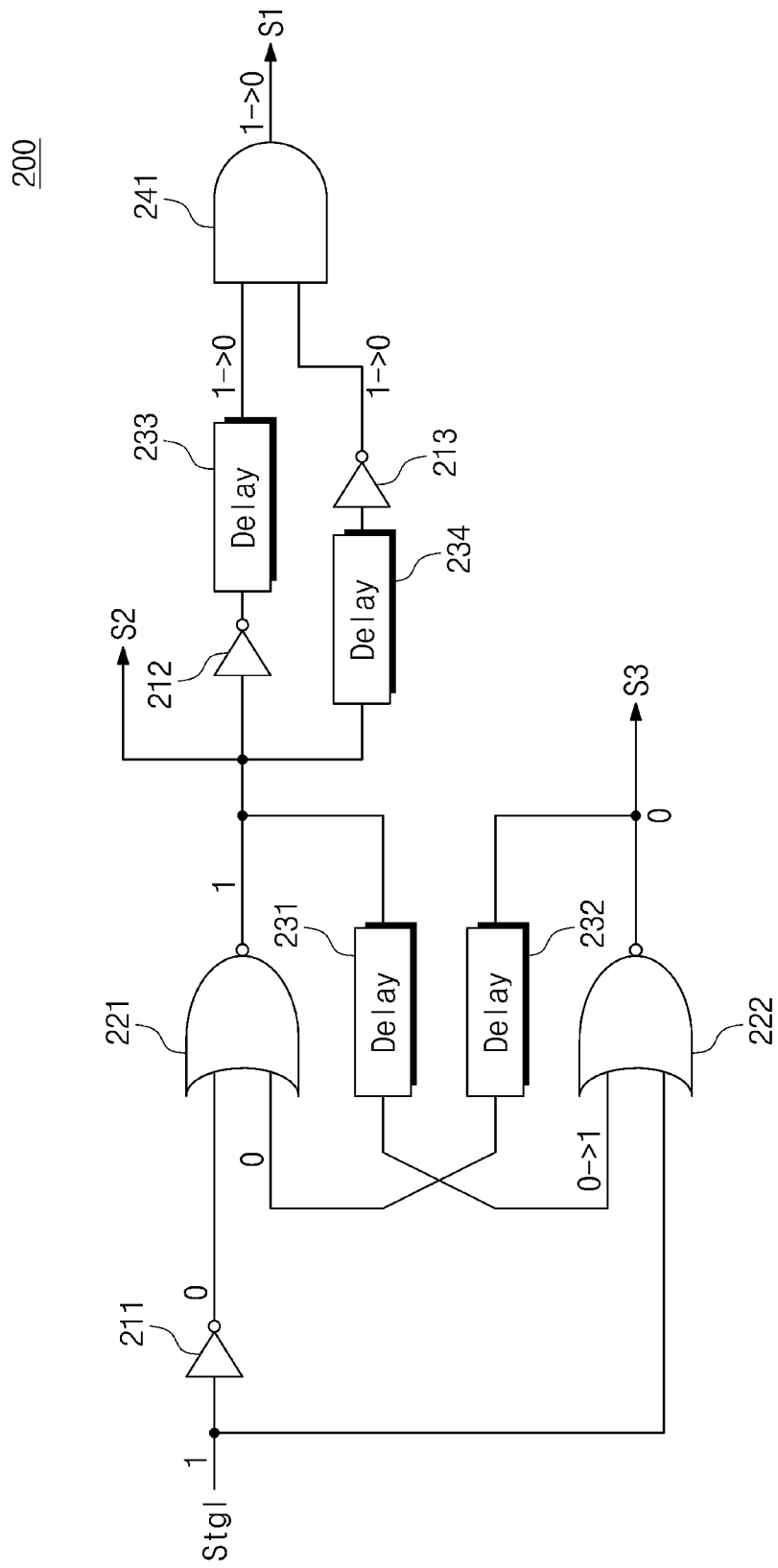
FIG. 8 illustrates logic levels of a controller of FIG. 3, which are changed at a third time of FIG. 4.

FIG. 8 illustrates logic levels of the controller 200 of FIG. 3, which are changed at the third time T3 of FIG. 4. Referring to FIGS. 4 and 8, an output of the first delay 231 may transition from the low level (0) to the high level (1) as the transition of the output of the first NOR block 221, that is, the transition of the second signal S2 is applied. Since the high levels (1, 1) are input to the second NOR block 222, an output of the second NOR block 222, that is, the third signal S3 may be maintained at the low level (0).

An output of the third delay 233 may transition from the high level (1) to the low level (0) as the transition of the output of the first NOR block 221, that is, the transition of the second signal S2 is applied. Also, an output of the third inverter 213 may transition from the high level (1) to the low level (0). Since the low levels (0, 0) are input to the AND block 241, an output of the AND block 241, that is, the first signal S1 may transition from the high level (1) to the low level (0).

Figure 9:
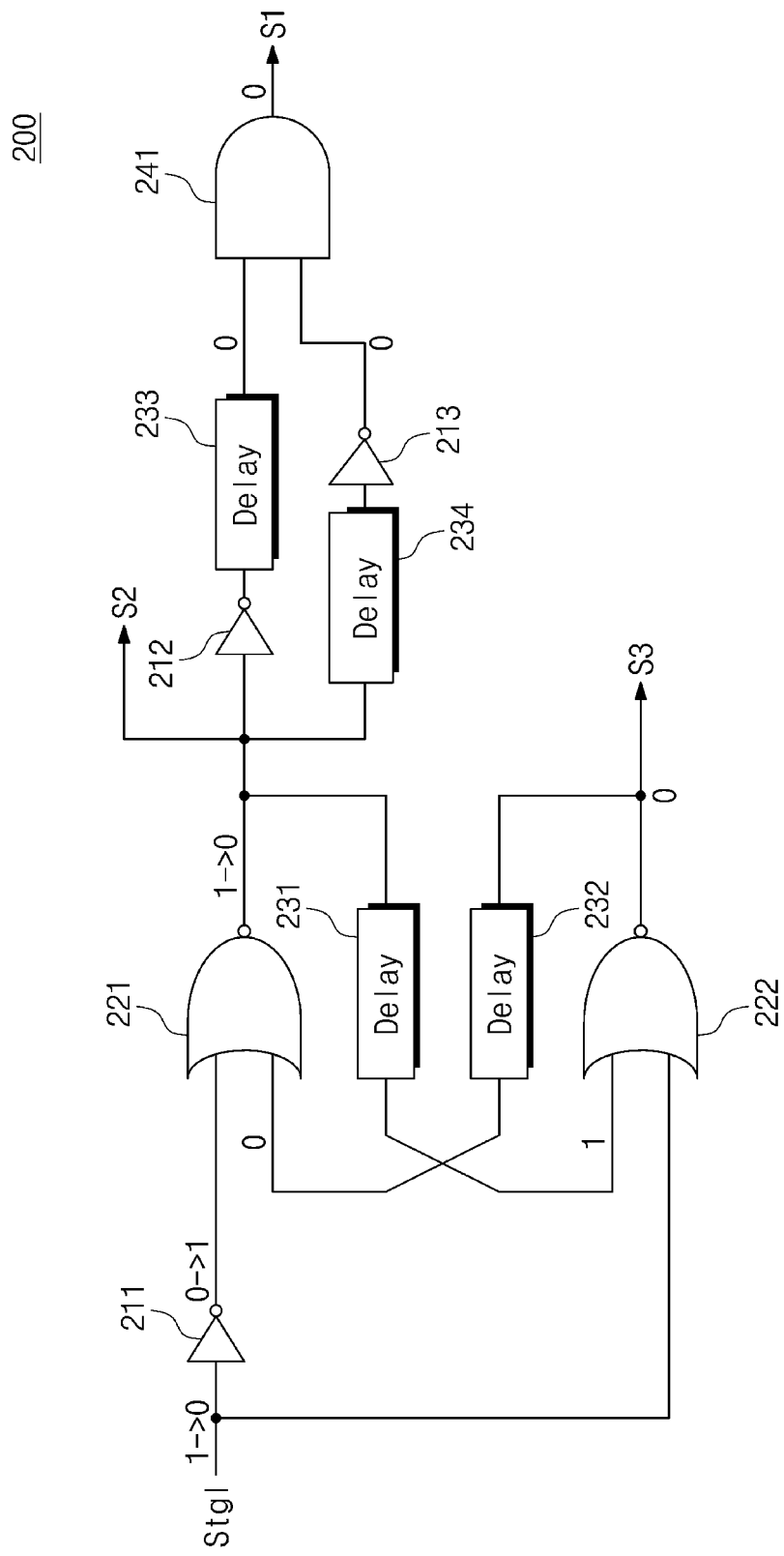
FIG. 9 illustrates logic levels of a controller of FIG. 3, which are changed at a fourth time of FIG. 4.

FIG. 9 illustrates logic levels of the controller 200 of FIG. 3, which are changed at the fourth time T4 of FIG. 4. Referring to FIGS. 4 and 9, the toggle signal Stgl may transition from the high level (1) to the low level (0). As the toggle signal Stgl transitions, the output of the first inverter 211 may transition from the low level (0) to the high level (1).

Since the high level (1) and the low level (0) are input to the first NOR block 221, the output of the first NOR block 221, that is, the second signal S2 may transition from the high level (1) to the low level (0). Since the high level (1) and the low level (0) are input to the second NOR block 222, the output of the second NOR block 222, that is, the third signal S3 may maintain the low level (0).

Due to the first to fourth delays 231 to 234, the transition of the toggle signal Stgl may not be yet applied to the first signal S1 and the second signal S2. That is, the dead time is defined by the first to fourth delays 231 to 234.

Figure 10:
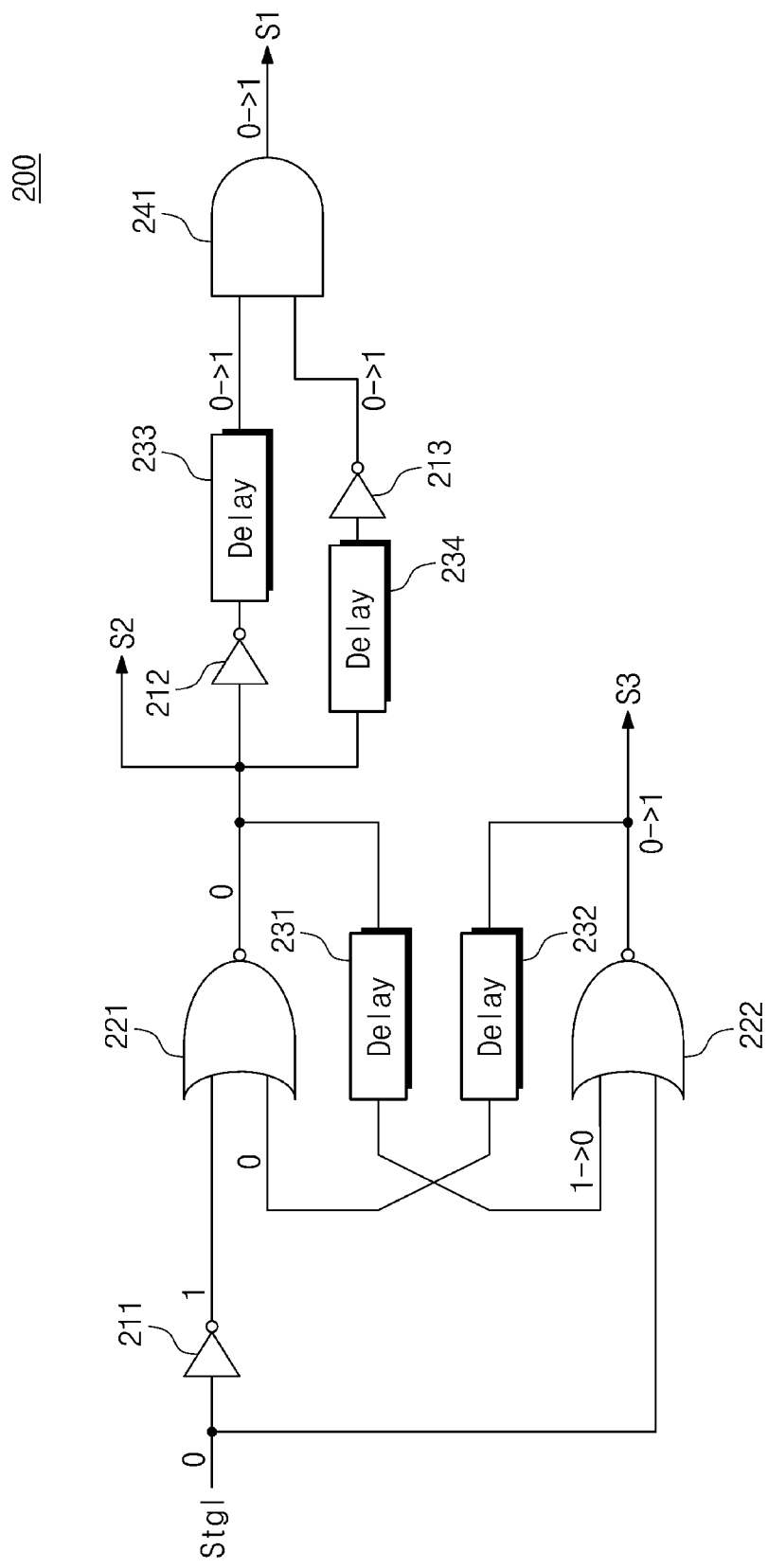
FIG. 10 illustrates logic levels of a controller of FIG. 3, which are changed at a fifth time of FIG. 4.

FIG. 10 illustrates logic levels of the controller 200 of FIG. 3, which are changed at the fifth time T5 of FIG. 4. Referring to FIGS. 4 and 10, the output of the first delay 231 may transition from the high level (1) to the low level (0) as the transition of the output of the first NOR block 221, that is, the transition of the second signal S2 is applied.

Since the low levels (0, 0) are input to the second NOR block 222, the output of the second NOR block 222, that is, the third signal S3 may transition from the low level (0) to the high level (1). Due to the third and fourth delays 233 and 234, the transition of the toggle signal Stgl may not be yet applied to the first signal S1. That is, an additional dead time is defined by the third and fourth delays 233 and 234.

Afterwards, as the transition of the toggle signal Stgl is applied, the output of the third delay 233 may transition from the low level (0) to the high level (1). Also, the output of the third inverter 213 may transition from the low level (0) to the high level (1). Since the high levels (1, 1) are input to the AND block 241, the output of the AND block 241, that is, the first signal S1 may transition from the low level (0) to the high level (1).

As described above, due to the first to fourth delays 231 to 234, the first to third signals S1 to S3 may not transition at the same time. The first to third signals S1 to S3 may sequentially transition with the dead time. Accordingly, an abnormal operation or a current leakage is prevented from occurring at the saw-tooth voltage generator 110, the sample block 120, and the hold block 130 of FIG. 1.

Figure 11:
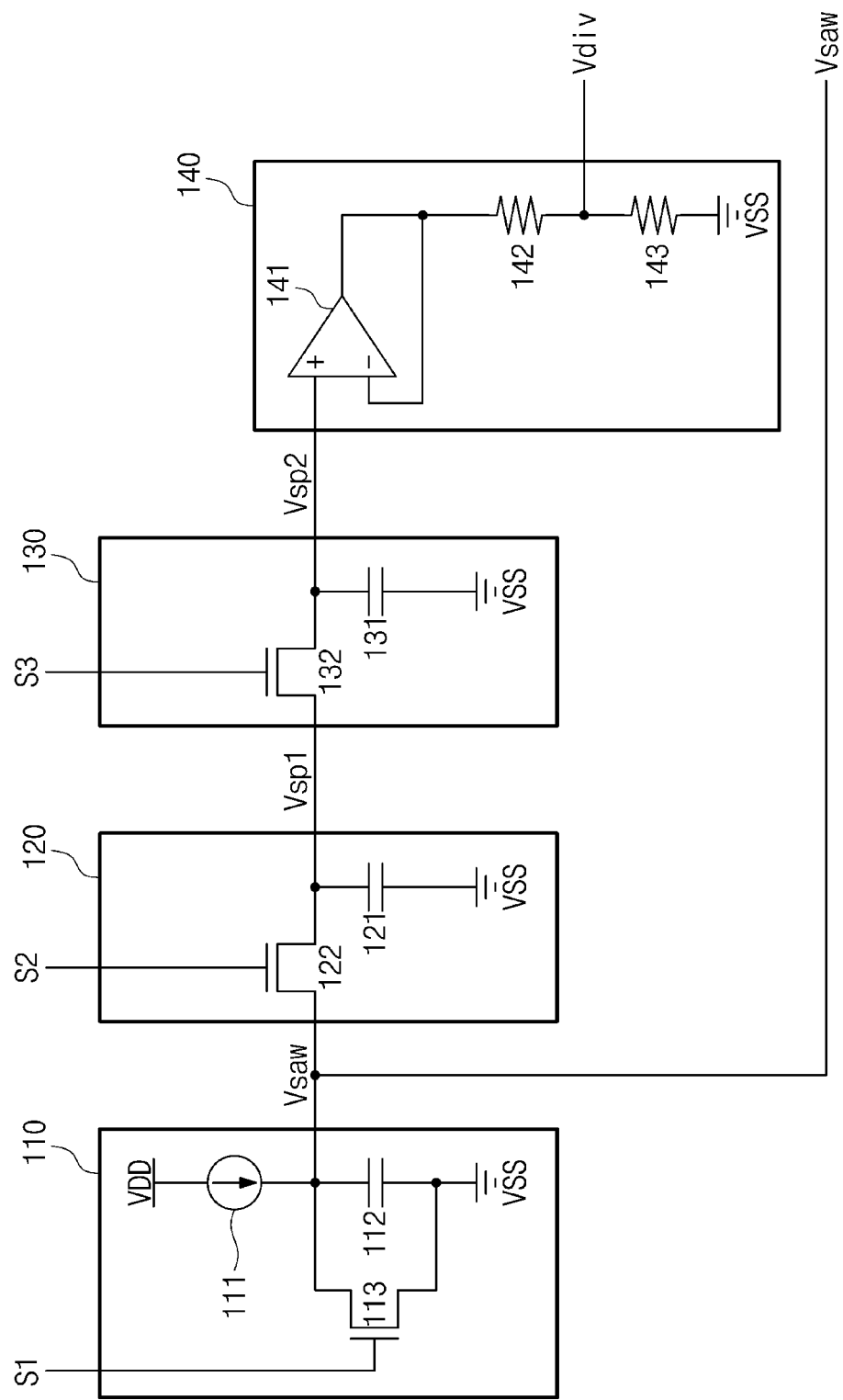
FIG. 11 illustrates a saw-tooth voltage generator, a sample block, a hold block, and a voltage divider according to an embodiment of the disclosure in detail.

FIG. 11 illustrates the saw-tooth voltage generator 110, the sample block 120, the hold block 130, and the voltage divider 140 according to an embodiment of the disclosure in detail. Referring to FIGS. 1 and 11, the saw-tooth voltage generator 110 includes a current source 111, a first capacitor 112, and a first transistor 113.

The current source 111 is connected between a power node to which a power supply voltage VDD is supplied and an output node from which the saw-tooth voltage Vsaw is output. The current source 111 may output a constant current toward the output node. The first capacitor 112 is connected between the output node and a ground node supplied with a ground voltage VSS. The first capacitor 112 may be charged by the current output from the current source 111 and may form the saw-tooth interval in which a level of the saw-tooth voltage Vsaw continuously increases.

The first transistor 113 is connected between the output node and the ground node. The first transistor 113 operates in response to the first signal S1. The first transistor 113 may be implemented with an NMOS transistor which is turned off when the first signal S1 is at the low level. The first transistor 113 may form an idle interval, in which the level of the saw-tooth voltage Vsaw is a ground level, by discharging the voltage charged in the first capacitor 112.

The sample block 120 includes a second capacitor 121 and a second transistor 122. The second capacitor 121 is connected between an output node from which the first sample voltage Vsp1 is output and the ground node supplied with the ground voltage VSS. The second transistor 122 is connected between the output node from which the first sample voltage Vsp1 is output and an input node to which the saw-tooth voltage Vsaw is input.

The second transistor 122 operates in response to the second signal S2. The second transistor 122 may be implemented with an NMOS transistor which is turned on when the second signal S2 is at the high level. When the second transistor 122 is turned on, a level of the saw-tooth voltage Vsaw may be charged to the second capacitor 121. That is, the level of the saw-tooth voltage Vsaw may be obtained (or stored or sampled). The voltage charged to the second capacitor 121 may be output as the first sample voltage Vsp1.

The hold block 130 includes a third capacitor 131 and a third transistor 132. The third capacitor 131 is connected between an output node from which the second sample voltage Vsp2 is output and the ground node supplied with the ground voltage VSS. The third transistor 132 is connected between the output node from which the second sample voltage Vsp2 is output and an input node to which the first sample voltage Vsp1 is input.

The third transistor 132 operates in response to the third signal S3. The third transistor 132 may be implemented with an NMOS transistor which is turned on when the third signal S3 is at the high level. When the third transistor 132 is turned on, the first sample voltage Vsp1 charged to the second capacitor 121 may be charged to the third capacitor 131. That is, the first sample voltage Vsp1 may be retained (or held). The voltage charged to the third capacitor 131 may be output as the second sample voltage Vsp2.

The voltage divider 140 includes an amplifier 141, a first resistor 142, and a second resistor 143. The first resistor 142 and the second resistor 143 are connected in series between an output of the amplifier 141 and the ground node to which the ground voltage VSS is supplied. The second sample voltage Vsp2 is input to a positive input of the amplifier 141.

A negative input of the amplifier 141 is connected with an output of the amplifier 141. A voltage of a node between the first resistor 142 and the second resistor 143 may be the division voltage Vdiv.

As described above, a level of the saw-tooth voltage Vsaw at a particular timing may be provided to the voltage divider 140 as the first sample voltage Vsp1 and the second sample voltage Vsp2. The amplifier 141 of the voltage divider 140 is implemented with a voltage follower. The amplifier 141 may output the second sample voltage Vsp2 to the first resistor 142 and the second resistor 143. That is, the level of the saw-tooth voltage Vsaw at the particular timing is divided by the first resistor 142 and the second resistor 143 so as to be output as the division voltage Vdiv.

As described with reference to FIGS. 1 and 11, the duty timing detector 100 according to an embodiment of the disclosure has a feed-forward structure. The amplifier 141 of the voltage divider 140 is only a voltage follower and may be a part of the feed-forward structure of the duty timing detector 100. Due to the feed-forward structure, the duty timing detector 100 according to an embodiment of the disclosure may have high stability unnecessary to verify.

Figure 12:
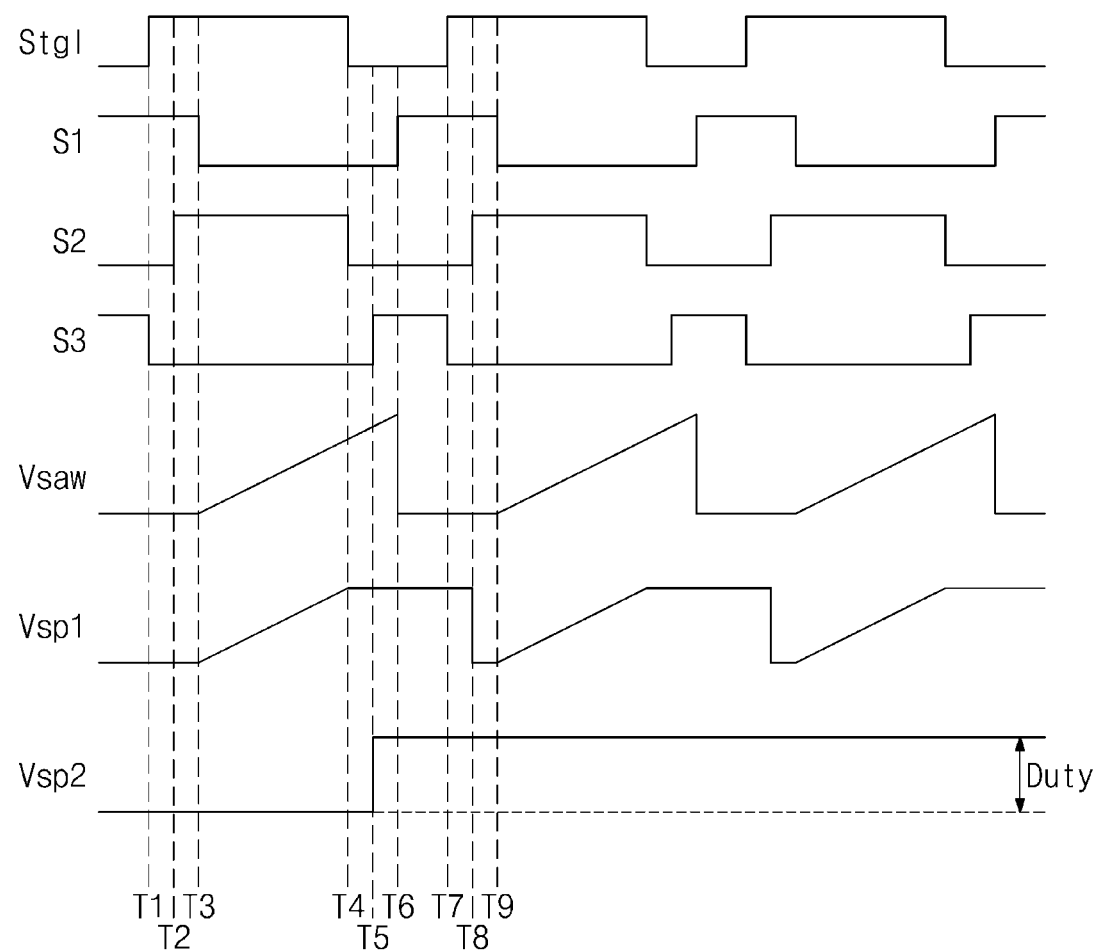
FIG. 12 illustrates an example of timings when a duty timing detector operates depending on first to third signals.

FIG. 12 illustrates an example of timings when the duty timing detector 100 operates depending on the first to third signals S1 to S3. Referring to FIGS. 1, 11, and 12, timings of the toggle signal Stgl and the first to third signals S1 to S3 are the same as described with reference to FIG. 4. Thus, additional description will be omitted to avoid redundancy.

In an embodiment, a description will be given under the assumption: from the first time T1, the controller 200 starts to control the first to third signals S1 to S3 and the saw-tooth voltage generator 110 starts to generate the saw-tooth voltage Vsaw. Also, it is assumed that voltages of the first, second, and third capacitors 112, 121, and 131 are a ground voltage before the first time T1.

At the first time T1, the third signal S3 may transition from the high level to the low level in synchronization with the toggle signal Stgl. The third transistor 132 is turned off in response to the third signal S3. The second capacitor 121 and the third capacitor 131 are electrically separated.

At the second time T2, the second signal S2 transitions from the low level to the high level in synchronization with the toggle signal Stgl. The second transistor 122 is turned on in response to the second signal S2. The first capacitor 112 and the second capacitor 121 are electrically connected.

At the first time T3, the first signal S1 may transition from the high level to the low level in synchronization with the toggle signal Stgl. The first transistor 113 is turned off in response to the first signal S1. As the first transistor 113 is turned off, the current from the current source 111 may be charged to the first capacitor 112 and the second capacitor 121. From the third time T3, levels of the saw-tooth voltage Vsaw and the first sample voltage Vsp1 may continuously increase.

At the fourth time T4, the second signal S2 may transition from the high level to the low level in synchronization with the toggle signal Stgl. The second transistor 122 is turned off in response to the second signal S2. The second capacitor 121 may obtain (or store or sample) a level of the saw-tooth voltage Vsaw when the second transistor 122 is turned off at the fourth time T4.

At the fifth time T5, the third signal S3 transitions from the low level to the high level in synchronization with the toggle signal Stgl. The third transistor 132 is turned on in response to the third signal S3. The second capacitor 121 and the third capacitor 131 are electrically connected, and thus, the first sample voltage Vsp1 is provided as the second sample voltage Vsp2. That is, at a fifth time T5, a level of the saw-tooth voltage Vsaw at the fourth time T4 is retained (or held) in the third capacitor 131 as the second sample voltage Vsp2.

At the sixth time T6, the first signal S1 transitions from the low level to the high level in synchronization with the toggle signal Stgl. The first transistor 113 is turned on in response to the first signal S1. A level of the saw-tooth voltage Vsaw may be discharged to a ground level at the sixth time T6 and may enter the idle interval.

Due to the dead time, the sample block 120 obtains the level of the saw-tooth voltage Vsaw before the saw-tooth voltage Vsaw reaches a final level. Accordingly, the level of the saw-tooth voltage Vsaw may be sampled by the sample block 120 without a noise associated with the generation and block of the saw-tooth voltage Vsaw.

Due to the dead time, the hold block 130 stores the first sample voltage Vsp1 as the second sample voltage Vsp2 after the sample block 120 blocks the electrical connection with the saw-tooth voltage Vsaw. Accordingly, an operation of the hold block 130 may have no influence on a sampling operation of the sample block 120.

At a seventh time T7, the third signal S3 transitions from the high level to the low level in synchronization with the toggle signal Stgl. The third transistor 132 is turned off in response to the third signal S3. That is, at the seventh time T7 and regardless of the operation of the sample block 120, the hold block 130 may retain the level of the saw-tooth voltage Vsaw at the fourth time T4 as the second sample voltage Vsp2.

At an eighth time T8, the second signal S2 transitions from the low level to the high level in synchronization with the toggle signal Stgl. The second transistor 122 is turned on in response to the second signal S2. Since the saw-tooth voltage Vsaw is in the idle interval, the first sample voltage Vsp1 becomes the ground level.

At a ninth time T9, the first signal S1 may transition from the high level to the low level in synchronization with the toggle signal Stgl. The first transistor 113 is turned off in response to the first signal S1. The saw-tooth voltage Vsaw and the first sample voltage Vsp1 may continuously increase from the ninth time T9.

In the following operation, the changes in the saw-tooth voltage Vsaw, the first sample voltage Vsp1, and the second sample voltage Vsp2 described with reference to the first to ninth times T1 to T9 may be repeated except that the second sample voltage Vsp2 is not the ground level.

As described with reference to FIG. 4, the dead time may correspond to a small interval (or a short time interval) to such an extent as to ignore compared with a period or a duty of the toggle signal Stgl. Accordingly, it may be understood that a period or a duty of each of the first to third signals S1 to S3 is substantially identical to a period or a duty of the toggle signal Stgl.

The saw-tooth voltage Vsaw may be understood as increasing during the duty of the toggle signal Stgl. The first sample voltage Vsp1 may also be understood as increasing during the duty of the toggle signal Stgl. The second sample voltage Vsp2 may be understood as having a level indicating a length (or a time) of the duty of the toggle signal Stgl.

A description is given with reference to FIGS. 1 and 11 as the comparator 150 compares the saw-tooth voltage Vsaw with the division voltage Vdiv. However, in the case where the dead time is short enough to ignore, the comparator 150 may be changed or modified to compare the division voltage Vdiv with the first sample voltage Vsp1 instead of the saw-tooth voltage Vsaw.

In the case where pulse width modulation (PWM) is applied to the toggle signal Stgl, a pulse width of the toggle signal Stgl, that is, the duty may vary. As the duty varies, an interval in which the saw-tooth voltage Vsaw and the first sample voltage Vsp1 increase may vary. The second sample voltage Vsp2 may have a level tracking the varying duty.

Figure 13:
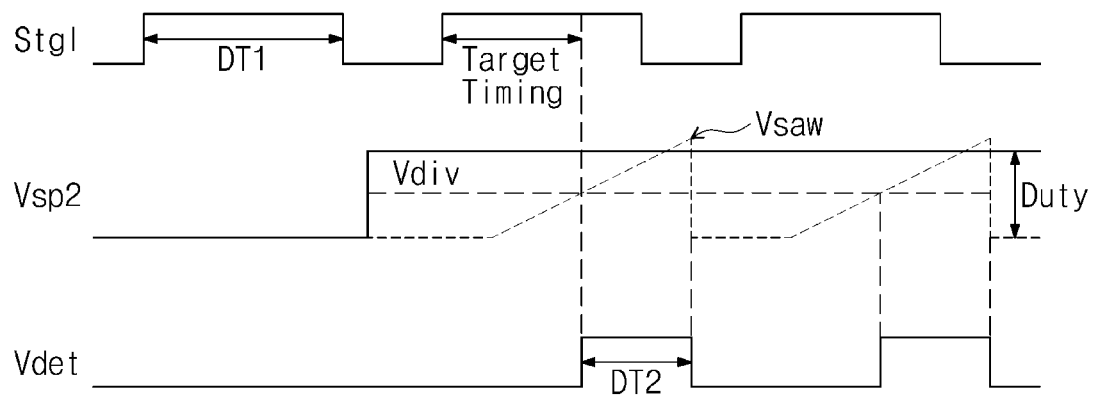
FIG. 13 illustrates an example in which a duty timing detector of FIG. 1 generates a detection voltage depending on a second sample voltage.

FIG. 13 illustrates an example in which a duty timing detector of FIG. 1 generates the detection voltage Vdet depending on the second sample voltage Vsp2. Referring to FIGS. 1 and 13, the second sample voltage Vsp2 may be generated as described with reference to FIG. 12, in response to the toggle signal Stgl.

A level of the second sample voltage Vsp2 includes information about a duty. For example, the level of the second sample voltage Vsp2 may be proportional to the duty. The level of the second sample voltage Vsp2 may be a maximum level of the saw-tooth voltage Vsaw determined by a width of a duty DT1 of the toggle signal Stgl.

The voltage divider 140 divides the second sample voltage Vsp2 to generate the division voltage Vdiv. When the saw-tooth voltage Vsaw indicating one duty of the toggle signal Stgl is not smaller than the division voltage Vdiv, the comparator 150 allows the detection voltage Vdet to transition to the high level.

The comparator 150 may detect the target timing corresponding to a ratio of a target value in each duty DT1 of the toggle signal Stgl, by allowing the detection voltage Vdet to transition to the high level at a timing corresponding to the ratio of the target value. The target timing may be determined depending on a ratio of the first resistor 142 and the second resistor 143.

The comparator 150 may output the detection voltage Vdet having a duty DT2 obtained by dividing the duty DT1 of the toggle signal Stgl, by maintaining the detection voltage Vdet at the high level during the remaining duty of the toggle signal Stgl from the target timing. A division ratio may be determined depending on a ratio of the first resistor 142 and the second resistor 143.

In an embodiment, resistance values of the first resistor 142 and the second resistor 143 may be determined depending on the target timing or a target ratio (a ratio of a duty). The first resistor 142 and the second resistor 143 may be implemented with variable resistors. That is, the target timing or the target ratio may be adjusted by a user.

In an embodiment, due to exaggeratedly expressed dead times, the duty of the detection voltage Vdet is illustrated as being delayed with respect to the duty of the toggle signal Stgl. However, the dead times may correspond to a small interval (or a short time interval) to such an extent as to ignore actually compared with a period or a duty of the toggle signal Stgl. Accordingly, actually, the duty of the detection voltage Vdet is illustrated as being not delayed with respect to the duty of the toggle signal Stgl.

For example, the first resistor 142 and the second resistor 143 may be implemented to have the same resistance value for the purpose of detecting a timing passing the half of each duty of the toggle signal Stgl. The division voltage Vdiv may have a level corresponding to half the level when the second sample voltage Vsp2 indicates a duty.

The detection voltage Vdet may transition from the low level to the high level at the timing passing the half of each duty of the toggle signal Stgl. Afterwards, the detection voltage Vdet may maintain the high level until the duty of the toggle signal Stgl ends. When the duty of the toggle signal Stgl ends, the detection voltage Vdet may transition from the high level to the low level. In FIGS. 12 and 13, because the delay between the toggle signal Stgl and the saw-tooth voltage Vsaw is emphasized, it appears that the transitions of the detection voltage Vdet are not accurately matched with the duty of the toggle signal Stgl. However, in practice, the delay may be small enough to be ignored, and thus the transitions of the detection voltage Vdet will match with the duty of the toggle signal Stgl.

According to an embodiment of the disclosure, by using simple analog circuits, the duty timing detector 100 may detect a target timing in each duty and may divide the duty by a target ratio. The target timing or the target ratio may be determined by ratios of resistors and may have an infinite resolution.

Figure 14:
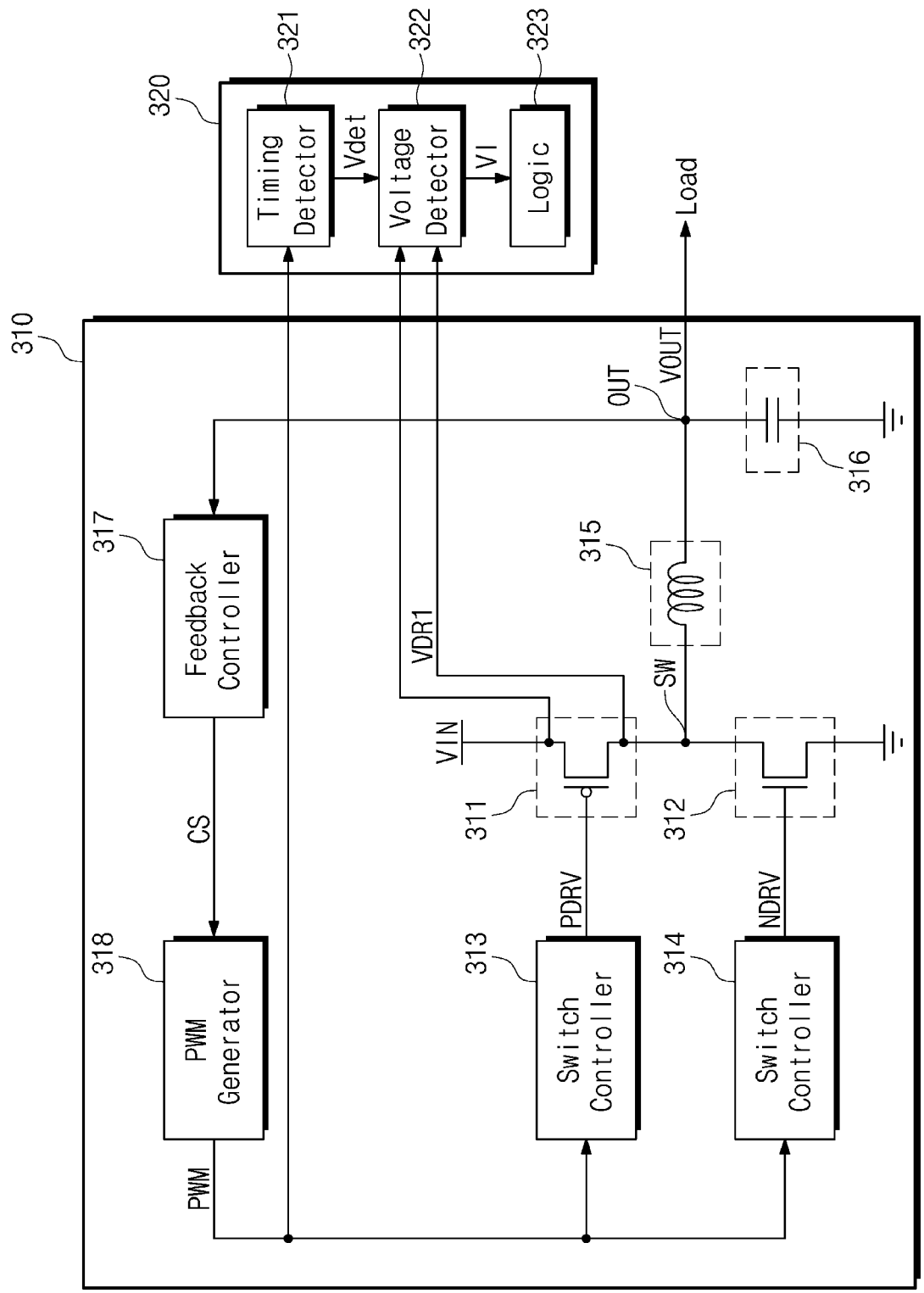
FIG. 14 illustrates a device according to a first embodiment of the disclosure.

FIG. 14 illustrates a device 300 according to a first embodiment of the disclosure. For example, the device 300 may be a power management device or a power management integrated circuit (PMIC). Referring to FIG. 14, the device 300 may include a voltage converter 310 and a current detector 320.

The voltage converter 310 may be a DC-DC converter. Also, the voltage converter 310 may be a buck converter which generates an output voltage VOUT lower than an input voltage VIN. Referring to FIG. 14, the voltage converter 310 includes a first switch 311, a second switch 312, a first switch controller 313, a second switch controller 314, a first charging element 315, a second charging element 316, a feedback controller 317, and a pulse width modulation signal generator 318.

The first switch 311 is connected between an input node to which the input voltage VIN is input and a switch node SW. The first switch 311 may operate in response to a first control signal PDRV output from the first switch controller 313. The first switch 311 may be a PMOS transistor.

The second switch 312 is connected between the switch node SW and the ground node. The second switch 312 may operate in response to a second control signal NDRV output from the second switch controller 314. The second switch 312 may be an NMOS transistor.

The first switch controller 313 is configured to control the first switch 311. The first switch controller 313 may activate or deactivate the first control signal PDRV in response to a pulse width modulation signal PWM. For example, the first switch controller 313 may receive a voltage of the switch node SW or the second control signal NDRV and may control the first control signal PDRV based on at least two of the pulse width modulation signal PWM, the voltage of the switch node SW, and the second control signal NDRV.

The second switch controller 314 is configured to control the second switch 312. The second switch controller 314 may activate or deactivate the second control signal NDRV in response to the pulse width modulation signal PWM. For example, the second switch controller 314 may receive the voltage of the switch node SW or the first control signal PDRV and may control the second control signal NDRV based on at least two of the pulse width modulation signal PWM, the voltage of the switch node SW, and the first control signal PDRV.

For example, the first switch controller 313 and the second switch controller 314 may control the first control signal PDRV and the second control signal NDRV to be complementary to each other. When the first control signal PDRV or the second control signal NDRV transitions, the first switch controller 313 and the second switch controller 314 may provide a dead time when both the first control signal PDRV and the second control signal NDRV are deactivated.

The first charging element 315 is connected between the switch node SW and an output node OUT from which the output voltage VOUT is output. The first charging element 315 may be an inductor. The second charging element 316 is connected between the output node OUT and the ground node. The second charging element 316 may be a capacitor.

The feedback controller 317 may detect a level of the output voltage VOUT. The feedback controller 317 may output a control signal CS depending on whether the output voltage VOUT is higher or lower in level than a target voltage. When the output voltage VOUT is higher in level than the target voltage, the feedback controller 317 may output the control signal CS such that the output voltage VOUT decreases. When the output voltage VOUT is lower in level than the target voltage, the feedback controller 317 may output the control signal CS such that the output voltage VOUT increases.

The pulse width modulation signal generator 318 may generate the pulse width modulation signal PWM in response to the control signal CS. For example, in the case where the control signal CS indicates that it is necessary to increase the output voltage VOUT, the pulse width modulation signal generator 318 may decrease (or increase) a pulse width of the pulse width modulation signal PWM. In the case where the control signal CS indicates that it is necessary to decrease the output voltage VOUT, the pulse width modulation signal generator 318 may increase (or decrease) the pulse width of the pulse width modulation signal PWM.

The current detector 320 may detect a current which is output from the voltage converter 310 to a load. The current detector 320 may include a timing detector 321, a voltage detector 322, and logic 323.

The timing detector 321 may receive the pulse width modulation signal PWM from the voltage converter 310. The timing detector 321 may detect a particular timing in a duty of the pulse width modulation signal PWM of the voltage converter 310. The timing detector 321 may include the duty timing detector 100 as described with reference to FIGS. 1 to 13. The particular timing may be determined depending on a ratio of resistance values of the first resistor 142 and the second resistor 143.

When the particular timing is detected, the timing detector 321 may allow the detection voltage Vdet to transition from the low level to the high level as described with reference to FIG. 13. When the duty of the pulse width modulation signal PWM ends, the timing detector 321 may allow the detection voltage Vdet to transition from the high level to the low level. The detection voltage Vdet may indicate the particular timing and may also have a duty obtained by dividing the duty of the pulse width modulation signal PWM.

The voltage detector 322 may detect a first voltage drop VDR1 within the voltage converter 310 in response to the detection voltage Vdet. For example, the voltage detector 322 may detect the first voltage drop VDR1 at the particular timing, that is, at a timing when the detection voltage Vdet transitions from the low level to the high level.

For example, the voltage detector 322 is configured to detect the first voltage drop VDR1 occurring at the first switch 311 of the converter 310. The voltage detector 322 may receive voltages of opposite ends of the first switch 311 and may detect a difference between the received voltages as the first voltage drop VDR1. The first voltage drop VDR1 may have a level corresponding to the amount of load current.

The voltage detector 322 may provide the first voltage drop VDR1 to the logic 323 as voltage information VI of a digital or analog form. The logic 323 may perform a preset calculation on the voltage information VI. The logic 323 may process the voltage information VI to obtain the accurate (or approximate) amount of load current. The logic 323 may control an operation or an operating mode of the voltage converter 310 by using the amount of load current. The logic 323 may provide the amount of load current to an external device automatically or depending on a request of the external device.

Figure 15:
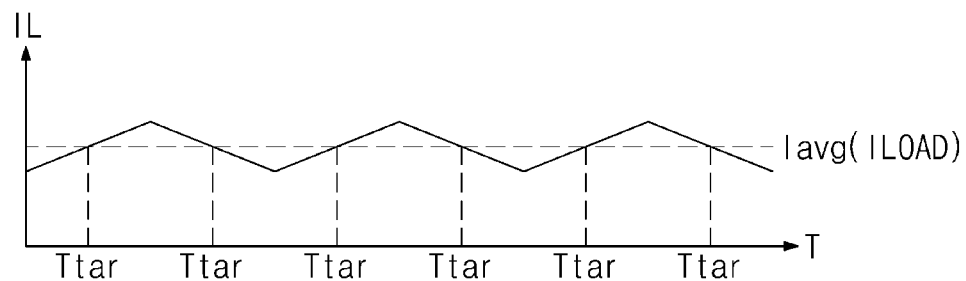
FIG. 15 illustrates fluctuations in an output current of a voltage converter.

FIG. 15 illustrates fluctuations in an output current of the voltage converter 310. In FIG. 15, a horizontal axis represents a time "T", and a vertical axis represents a current, for example, an inductor current IL flowing through the first charging element 315. Referring to FIGS. 14 and 15, the amount of inductor current IL may repeatedly increase and decrease. For example, when the first switch 311 is turned on, the amount of inductor current IL may increase. When the second switch 312 is turned on, the amount of inductor current IL may decrease.

When the inductor current IL repeatedly increases and decreases, an average current Iavg may be an intermediate value between a maximum value and a minimum value of the inductor current IL. In the case where the amount of inductor current IL is detected at target timings Ttar when the inductor current IL passes the intermediate value, the amount of average current Iavg, that is, the amount of load current ILOAD may be obtained.

Figure 16:
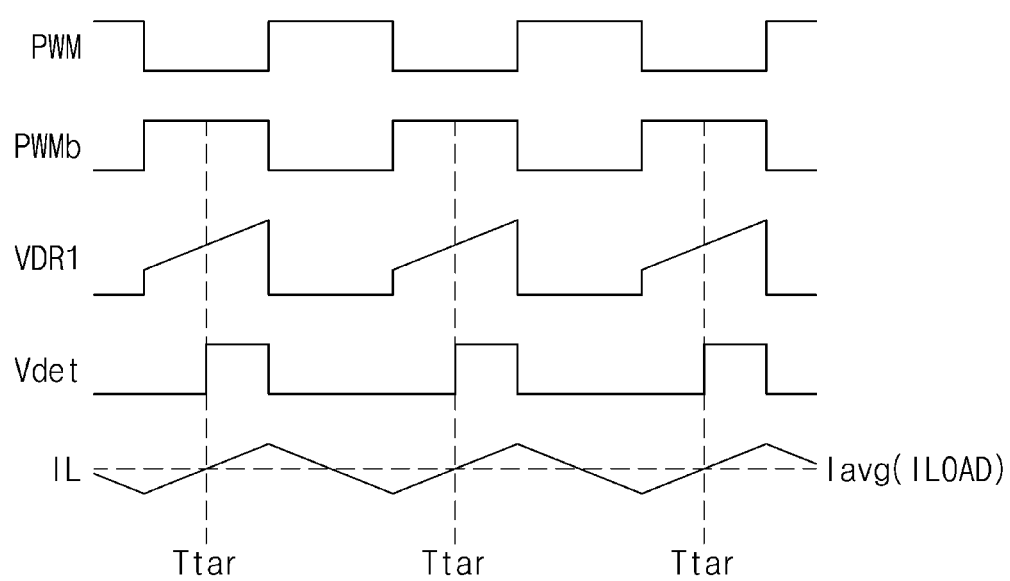
FIG. 16 illustrates examples in which a pulse width modulation signal, a first voltage drop, a detection voltage, and an inductor current vary.

FIG. 16 illustrates examples in which the pulse width modulation signal PWM, the first voltage drop VDR1, the detection voltage Vdet, and the inductor current IL vary. Referring to FIGS. 14 and 16, the first switch 311 is turned on when the pulse width modulation signal PWM is at the low level. Accordingly, with regard to the first switch 311, a duty of an inversion signal PWMb corresponding to an inverted version of the pulse width modulation signal PWM may be referenced. For example, the inversion signal PWMb may be an output signal of the first inverter 211 described with reference to FIG. 3.

When the inversion signal PWMb is at the high level, the first switch 311 is turned on. When the first switch 311 is turned on, the amount of inductor current IL increases. When half the duty of the inversion signal PWMb passes, the inductor current IL has a current amount corresponding to the load current ILOAD. Accordingly, the timing detector 321 may be implemented to have a time point when half the duty of the inversion signal PWMb passes, as the target timing Ttar. For example, the first resistor 142 (refer to FIG. 11) and the second resistor 143 of the voltage divider 140 (refer to FIG. 1) may be implemented to have the same resistance value.

When the detection voltage Vdet indicates that half the duty of the inversion signal PWMb passes, the average current Iavg, that is, the load current ILOAD may be obtained from the inductor current IL. In general, the amount of current may be sensed by inserting a resistor in a line through which the current flows and sensing a voltage across the resistor.

However, this scheme causes power loss by the current flowing through the resistor. Also, a resistor with high accuracy is necessary to measure the amount of current with high accuracy, and thus, the resistor may be installed outside a semiconductor chip or a package. This causes an increase in an area.

According to an embodiment of the disclosure, as illustrated in FIG. 14, a voltage across the first switch 311 is sensed when the first switch 311 is turned on, and the amount of current is calculated by using the sensed voltage as a voltage drop. Accordingly, the power loss and an increase in an area are prevented.

As illustrated in FIG. 16, a waveform of the first voltage drop VDR1 identically tracks a waveform when the inductor current IL increases. Accordingly, information corresponding to the load current ILOAD may be obtained by detecting the first voltage drop VDR1 at the target timing Ttar. The information of the load current ILOAD is obtained without an additional element and power loss, by detecting the first voltage drop VDR1. The voltage detector 322 may provide the voltage information VI of the first voltage drop VDR1 to the logic 323.

The logic 323 may calculate the load current ILOAD from the voltage information VI. For example, when the first switch 311 is turned on, a current flows from a power node to the load through the first switch 311 and the first charging element 315. A great part of a resistance component of the first switch 311 and the first charging element 315 corresponds to a resistance component of the first switch 311. Accordingly, the logic 323 may obtain a value of the load current ILOAD by dividing the voltage information VI indicating the first voltage drop VDR1 by a resistance value of the first switch 311.

For example, the logic 323 may store information of a resistance value of the first switch 311. The logic 323 may store information of a resistance value of the first switch 311, which varies with a temperature. The logic 323 may obtain temperature information from a temperature sensor positioned inside or outside the device 300 and may select a resistance value of the first switch 311 depending on temperature information.

An embodiment is described in FIGS. 14 to 16 as the voltage converter 310 uses the pulse width modulation signal generator 318 and the pulse width modulation signal PWM. However, the pulse width modulation signal generator 318 of the voltage converter 310 may be replaced with a pulse frequency modulation signal generator or may be provided together with a pulse frequency modulation signal generator so as to selectively operate. The first switch controller 313, the second switch controller 314, and the timing detector 321 may operate in response to a pulse width modulation signal or a pulse frequency modulation signal.

Figure 17:
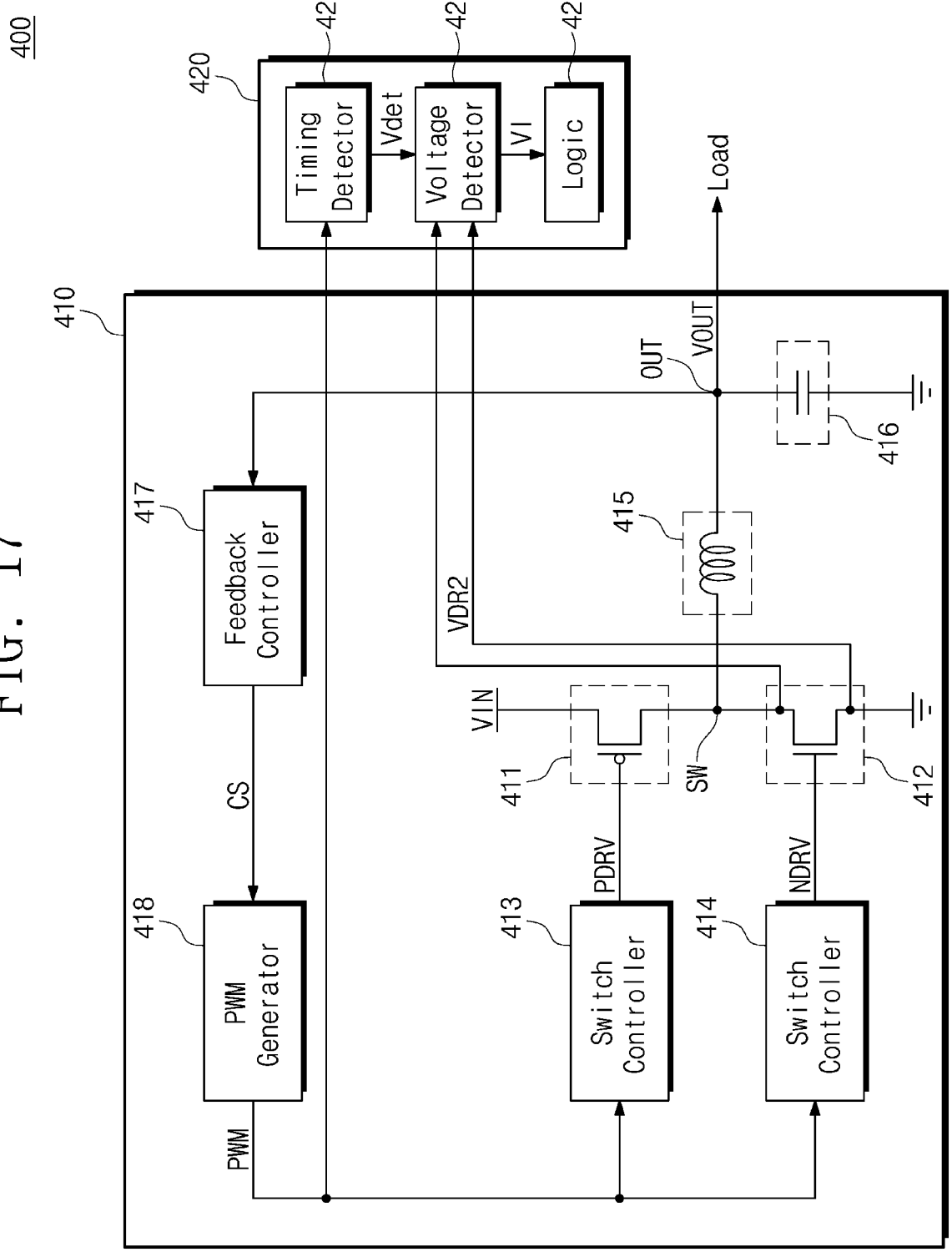
FIG. 17 illustrates a device according to a second embodiment of the disclosure.

FIG. 17 illustrates a device 400 according to a second embodiment of the disclosure. Referring to FIG. 17, the device 400 may include a voltage converter 410 and a current detector 420. The voltage converter 410 includes a first switch 411, a second switch 412, a first switch controller 413, a second switch controller 414, a first charging element 415, a second charging element 416, a feedback controller 417, and a pulse width modulation signal generator 418.

A configuration and an operation of the voltage converter 410 are identical to the voltage converter 310 described with reference to FIG. 14. Thus, additional description associated with the voltage converter 410 will be omitted to avoid redundancy.

The current detector 420 may include a timing detector 421, a voltage detector 422, and logic 423. A configuration and an operation of the current detector 420 may be substantially identical (or similar) to the current detector 320 described with reference to FIG. 14 except that the voltage detector 422 detects a second voltage drop VDR2 of the second switch 412, not the first voltage drop VDR1 of the first switch 411.

Figure 18:
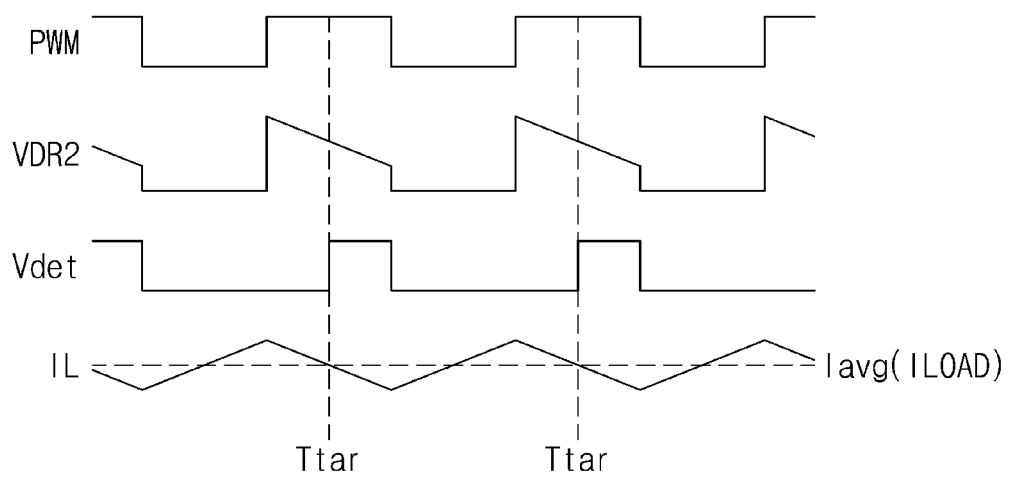
FIG. 18 illustrates examples in which a pulse width modulation signal, a second voltage drop, a detection voltage, and an inductor current vary.

FIG. 18 illustrates examples in which the pulse width modulation signal PWM, the second voltage drop VDR2, the detection voltage Vdet, and the inductor current IL vary. Referring to FIGS. 17 and 18, the second switch 412 is turned on when the pulse width modulation signal PWM is at the high level. Accordingly, with regard to the second switch 412, a duty of the pulse width modulation signal PWM may be referenced.

When the pulse width modulation signal PWM is at the high level, the second switch 412 is turned on. When the second switch 412 is turned on, the amount of inductor current IL decreases. When half the duty of the pulse width modulation signal PWM passes, the inductor current IL has a current amount corresponding to the average current Iavg, for example, the load current ILOAD. Accordingly, the timing detector 421 may be implemented to have a time point when half the duty of the pulse width modulation signal PWM passes, as the target timing Ttar.

In the case where the detection voltage Vdet indicates when half the duty of the pulse width modulation signal PWM passes, the voltage detector 422 may detect the second voltage drop VDR2. As illustrated in FIG. 18, a waveform of the second voltage drop VDR2 identically tracks a waveform when the inductor current IL decreases. Accordingly, information corresponding to the load current ILOAD may be obtained by detecting the second voltage drop VDR2 at the target timing Ttar. The voltage detector 422 may provide the voltage information VI of the second voltage drop VDR2 to the logic 423.

The logic 423 may calculate the load current ILOAD from the voltage information VI. For example, when the second switch 412 is turned on, a current flows from the load to a ground node through the second switch 412 and the first charging element 415. A great part of a resistance component of the second switch 412 and the first charging element 415 corresponds to a resistance component of the second switch 412. Accordingly, the logic 423 may obtain a value of the load current ILOAD by dividing the voltage information VI indicating the second voltage drop VDR2 by a resistance value of the second switch 412.

For example, the logic 423 may store information of a resistance value of the second switch 412. The logic 423 may store information of a resistance value of the second switch 412, which varies with a temperature. The logic 423 may obtain temperature information from a temperature sensor positioned inside or outside the device 400 and may select a resistance value of the second switch 412 depending on temperature information.

An embodiment is described in FIGS. 17 to 18 as the voltage converter 410 uses the pulse width modulation signal generator 418 and the pulse width modulation signal PWM. However, the pulse width modulation signal generator 418 of the voltage converter 410 may be replaced with a pulse frequency modulation signal generator or may be provided together with a pulse frequency modulation signal generator so as to selectively operate. The first switch controller 413, the second switch controller 414, and the timing detector 421 may operate in response to a pulse width modulation signal or a pulse frequency modulation signal.

Figure 19:
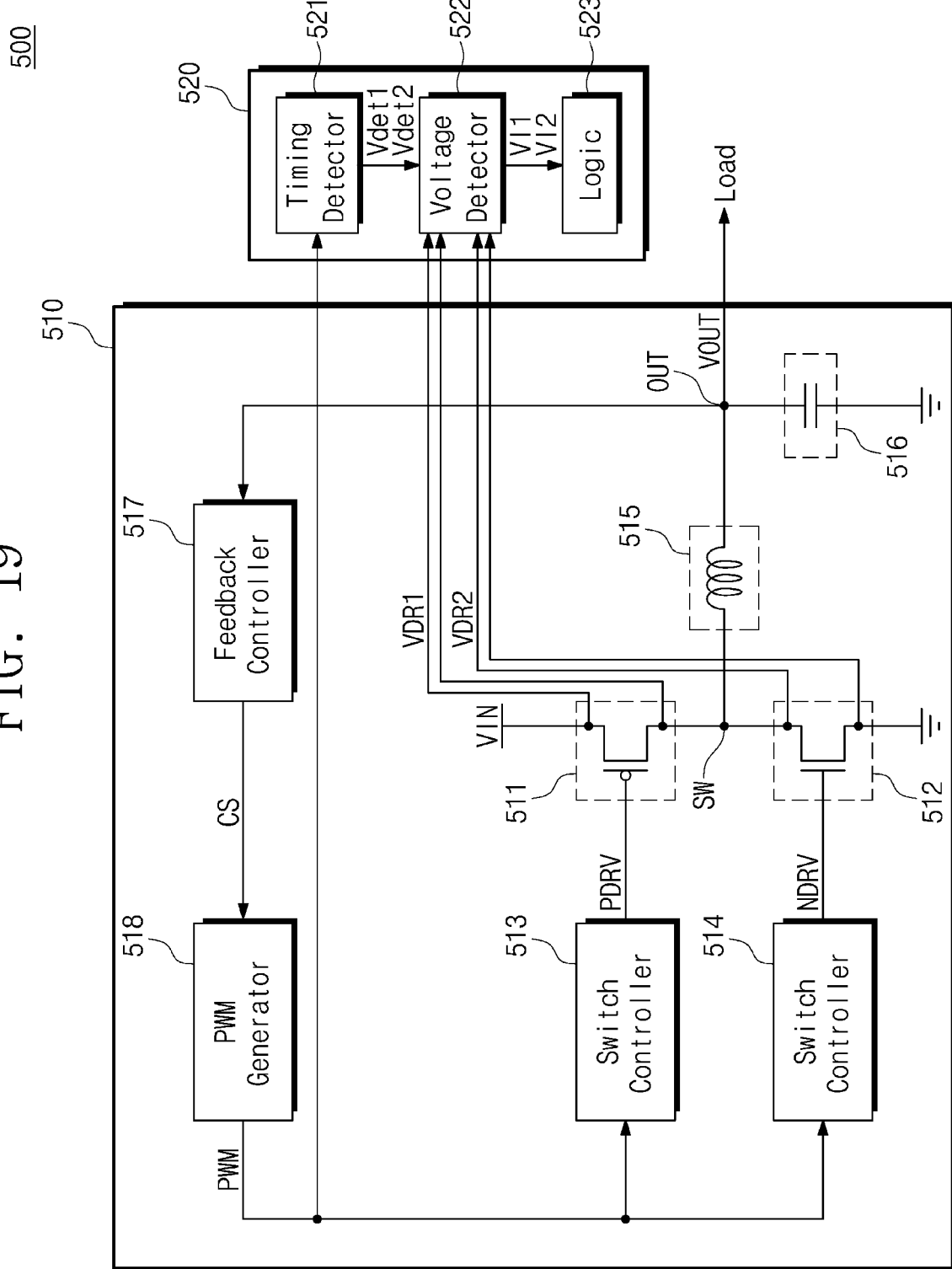
FIG. 19 illustrates a device according to a third embodiment of the disclosure.

FIG. 19 illustrates a device 500 according to a third embodiment of the disclosure. Referring to FIG. 19, the device 500 may include a voltage converter 510 and a current detector 520. The voltage converter 510 includes a first switch 511, a second switch 512, a first switch controller 513, a second switch controller 514, a first charging element 515, a second charging element 516, a feedback controller 517, and a pulse width modulation signal generator 518.

A configuration and an operation of the voltage converter 510 are identical to the voltage converter 310 or 410 described with reference to FIG. 14. Thus, additional description associated with the voltage converter 510 will be omitted to avoid redundancy.

The current detector 520 may include a timing detector 521, a voltage detector 522, and logic 523. As described with reference to FIGS. 14 and 16, the timing detector 521 may allow a first detection voltage Vdet1 to transition to the high level when half the duty of the inversion signal PWMb (refer to FIG. 20) corresponding to an inverted version of the pulse width modulation signal PWM passes.

As described with reference to FIGS. 1 and 18, the timing detector 321 may allow a second detection voltage Vdet2 to transition to the high level when half the duty of the pulse width modulation signal PWM (refer to FIG. 20) passes.

For example, the timing detector 521 may include a first block configured to generate the first detection voltage Vdet1 from the inversion signal PWMb and a second block configured to generate the second detection voltage Vdet2 from the pulse width modulation signal PWM. Each of the first block and the second block may include a configuration described with reference to FIG. 12. The first block and the second block may share the controller 200 described with reference to FIG. 3.

As described with reference to FIGS. 14 and 16, the voltage detector 522 may detect the first voltage drop VDR1 from the first switch 511 in response to the first detection voltage Vdet1. First voltage information VI1 of the first voltage drop VDR1 may be provided to the logic 523.

As described with reference to FIGS. 17 and 18, the voltage detector 522 may detect the second voltage drop VDR2 from the second switch 512 in response to the second detection voltage Vdet2. Second voltage information VI2 of the second voltage drop VDR2 may be provided to the logic 523.

As described with reference to FIGS. 14 and 16, the logic 523 may calculate the load current ILOAD (refer to FIG. 20) by using a resistance value of the first switch 511 and the first voltage information VI1. As described with reference to FIGS. 17 and 18, the logic 523 may calculate the load current ILOAD (refer to FIG. 20) by using a resistance value of the second switch 512 and the second voltage information VI2.

Figure 20:
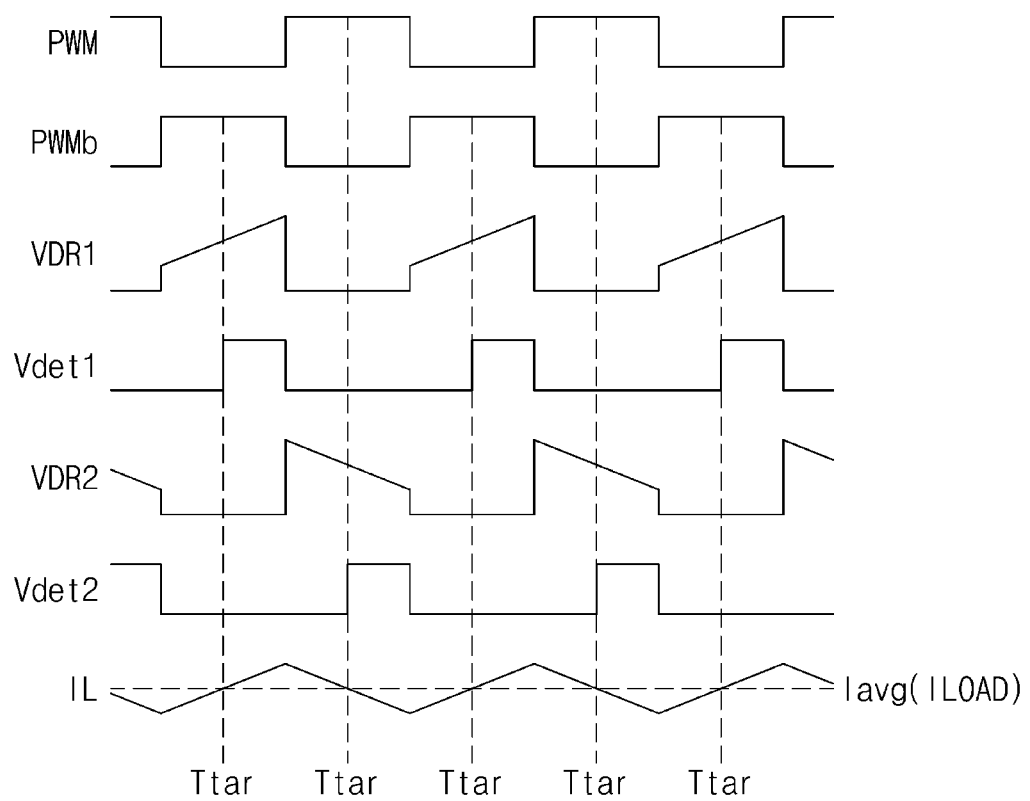
FIG. 20 illustrates examples in which a pulse width modulation signal, a first voltage drop, a second voltage drop, a detection voltage, and an inductor current vary.

FIG. 20 illustrates examples in which the pulse width modulation signal PWM, the first voltage drop VDR1, the second voltage drop VDR2, the detection voltage Vdet, and the inductor current IL vary. Referring to FIGS. 19 and 20, the timing detector 521 may allow the first detection voltage Vdet1 to transition to the high level when half the duty of the inversion signal PWMb corresponding to an inverted version of the pulse width modulation signal PWM passes, as described with reference to FIG. 16.

Also, as described with reference to FIG. 18, the timing detector 521 may allow the second detection voltage Vdet2 to transition to the high level when half the duty of the pulse width modulation signal PWM passes.

As described with reference to FIG. 16, the voltage detector 522 may detect the first voltage drop VDR1 in response to the first detection voltage Vdet1. As described with reference to FIG. 18, the voltage detector 522 may detect the second voltage drop VDR2 in response to the second detection voltage Vdet2. The voltage detector 522 may provide the first voltage drop VDR1 and the second voltage drop VDR2 to the logic 523 as the voltage information VI.

As described with reference to FIG. 16, the logic 523 may calculate the load current ILOAD from a resistance value of the first switch 511 and the first voltage information VI1 corresponding to the first voltage drop VDR1. As described with reference to FIG. 18, the logic 523 may calculate the load current ILOAD from a resistance value of the second switch 512 and the second voltage information VI2 corresponding to the second voltage drop VDR2.

An embodiment is described in FIGS. 19 to 20 as the voltage converter 510 uses the pulse width modulation signal generator 518 and the pulse width modulation signal PWM. However, the pulse width modulation signal generator 518 of the voltage converter 510 may be replaced with a pulse frequency modulation signal generator or may be provided together with a pulse frequency modulation signal generator so as to selectively operate. The first switch controller 513, the second switch controller 514, and the timing detector 521 may operate in response to a pulse width modulation signal or a pulse frequency modulation signal.

Figure 21:
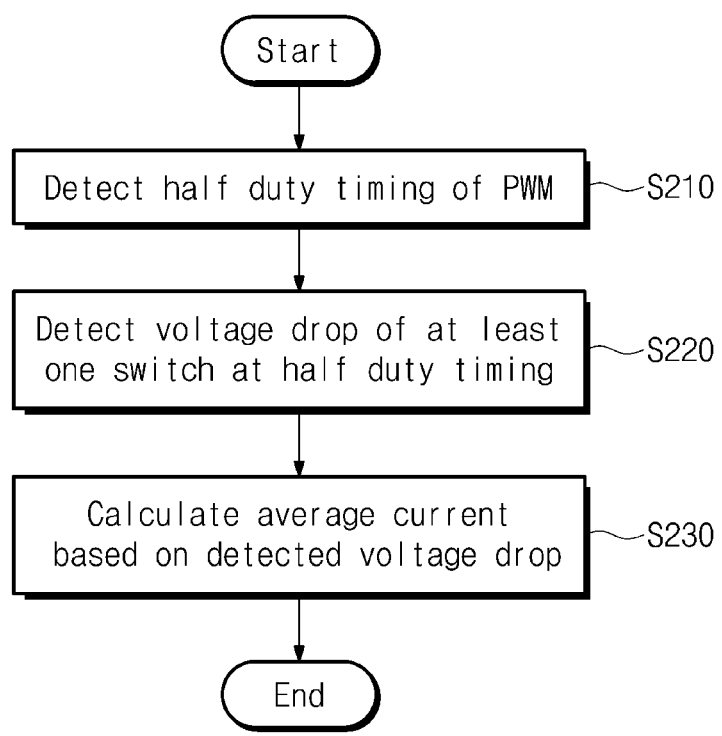
FIG. 21 is a flowchart illustrating an operating method of a device according to an embodiment of the disclosure.

FIG. 21 is a flowchart illustrating an operating method of the device 300, 400, or 500 according to an embodiment of the disclosure. Referring to FIGS. 14, 17, 19, and 21, in operation S210, the timing detector 321, 421, or 521 of the current detector 320, 420, or 520 of the device 300, 400, or 500 may detect a half-duty timing of the pulse width modulation signal PWM (or the inversion signal PWMb).

In operation S220, the voltage detector 322, 422, or 522 of the current detector 320, 420, or 520 of the device 300, 400, or 500 may detect the voltage drop VDR1 or VDR2 of at least one switch 311 or 312, 411 or 412, or 511 or 512 of the voltage converter 310, 410, or 510 at the half-duty timing.

In operation S230, the logic 323, 423, or 523 of the current detector 320, 420, or 520 of the device 300, 400, or 500 may calculate a load current based on the detected voltage drop VDR1 or VDR2.

Figure 22:
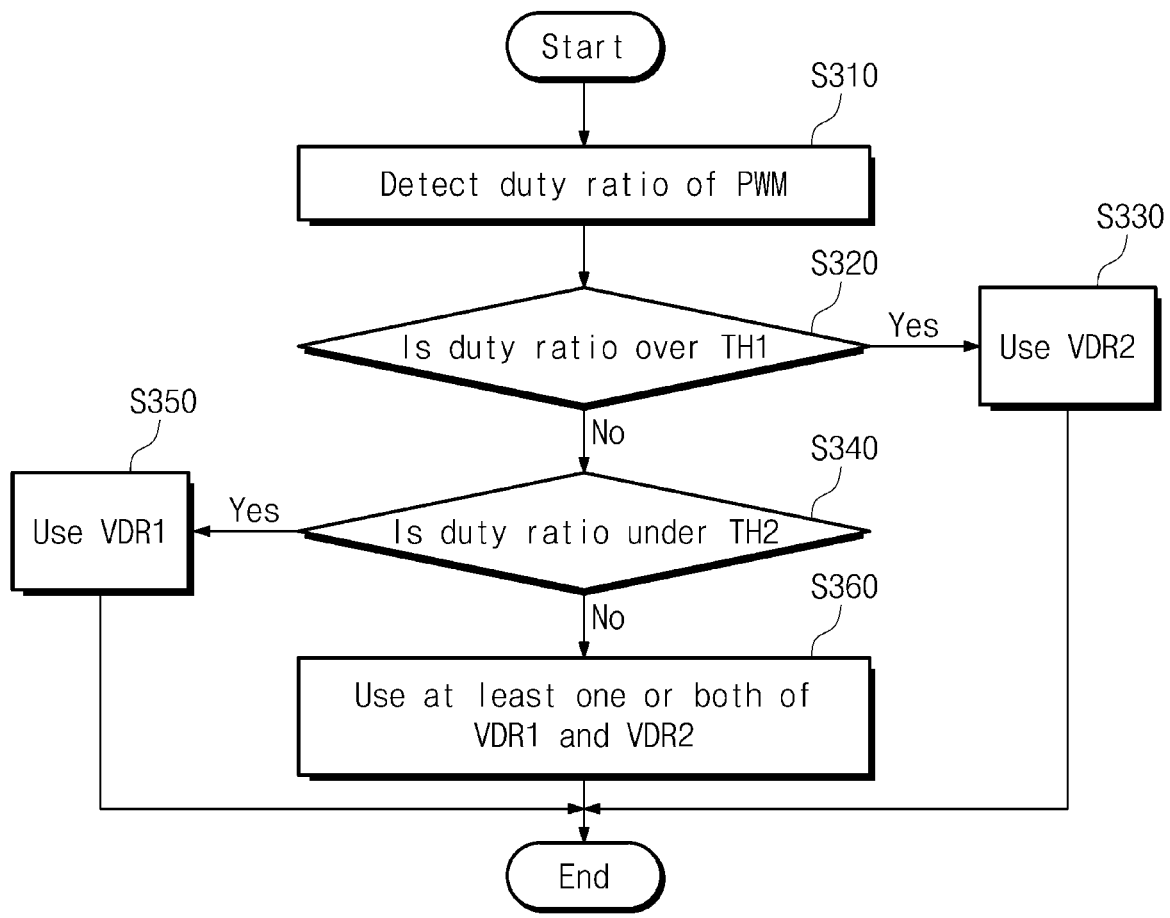
FIG. 22 is a flowchart illustrating an operating method of a device according to another embodiment of the disclosure.

FIG. 22 is a flowchart illustrating an operating method of the device 300, 400, or 500 according to another embodiment of the disclosure. Referring to FIGS. 14, 17, 19, and 22, in operation S310, the current detector 320, 420, or 520 of the device 300, 400, or 500 may detect a duty ratio of the pulse width modulation signal PWM.

In operation S320, the current detector 320, 420, or 520 of the device 300, 400, or 500 may determine whether the duty ratio is over a first threshold TH1. When the duty ratio is over the first threshold TH1, in operation S330, the current detector 320, 420, or 520 of the device 300, 400, or 500 may perform current detection by using the second voltage drop VDR2.

When the duty ratio is not greater than the first threshold TH1, in operation S340, the current detector 320, 420, or 520 of the device 300, 400, or 500 may determine whether the duty ratio is under a second threshold TH2. The second threshold TH2 may be smaller than the first threshold TH1. When the duty ratio is under the second threshold TH2, in operation S350, the current detector 320, 420, or 520 of the device 300, 400, or 500 may perform current detection by using the first voltage drop VDR1.

When the duty ratio is not smaller than the second threshold TH2, in operation S360, the current detector 320, 420, or 520 of the device 300, 400, or 500 may perform current detection by using at least one or both of the first voltage drop VDR1 and the second voltage drop VDR2.

When the duty ratio of the pulse width modulation signal PWM is over the first threshold TH1, it may be more stable and easier to generate the detection voltage Vdet from the duty of the pulse width modulation signal PWM by using the second voltage drop VDR2. When the duty ratio of the pulse width modulation signal PWM is under the second threshold TH2, it may be more stable and easier to generate the detection voltage Vdet from the duty of the inversion signal PWMb by using the first voltage drop VDR1.

Figure 23:
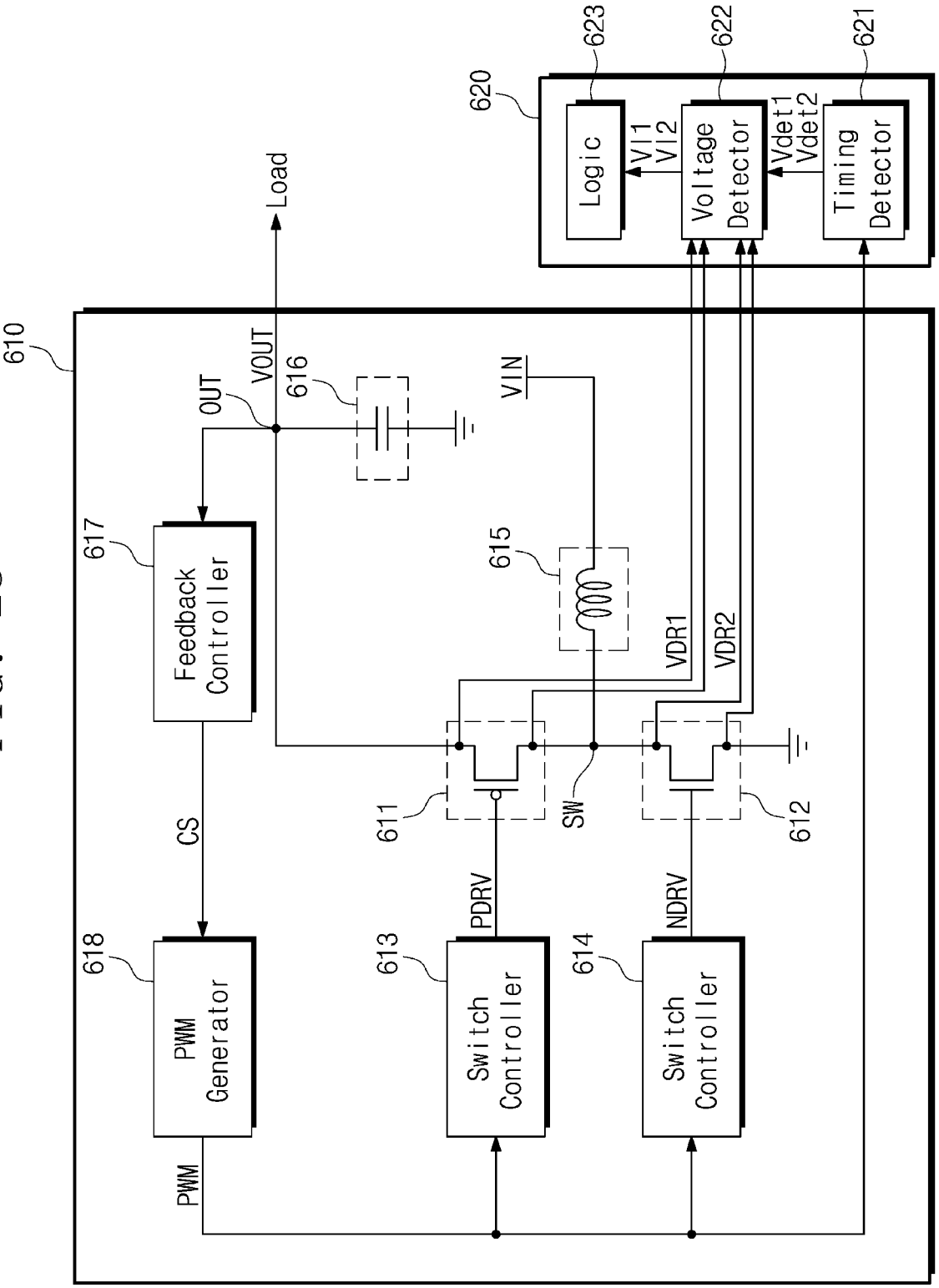
FIG. 23 illustrates a device according to a fourth embodiment of the disclosure.

FIG. 23 illustrates a device 600 according to a fourth embodiment of the disclosure. For example, the device 600 may be a power management device or a power management integrated circuit (PMIC). Referring to FIG. 23, the device 600 may include a voltage converter 610 and a current detector 620.

The voltage converter 610 may be a DC-DC converter. Also, the voltage converter 610 may be a boost converter which generates an output voltage VOUT higher than an input voltage VIN. The voltage converter 610 includes a first switch 611, a second switch 612, a first switch controller 613, a second switch controller 614, a first charging element 615, a second charging element 616, a feedback controller 617, and a pulse width modulation signal generator 618.

The first switch 611 is connected between the output node OUT from which the output voltage VOUT is output and the switch node SW. The first switch 611 may operate in response to a first control signal PDRV output from the first switch controller 613. The first switch 611 may be a PMOS transistor.

The second switch 612 is connected between the switch node SW and the ground node. The second switch 612 may operate in response to a second control signal NDRV output from the second switch controller 614. The second switch 612 may be an NMOS transistor.

As described with reference to FIGS. 14 to 22, the first switch controller 613 and the second switch controller 614 may respectively output the first control signal PDRV and the second control signal NDRV in response to the pulse width modulation signal PWM.

The first charging element 615 is connected between the input node to which the input voltage VIN is input and the switch node SW. The first charging element 615 may be an inductor. The second charging element 616 is connected between the output node OUT and the ground node. The second charging element 616 may be a capacitor.

As described with reference to FIGS. 14 to 23, the feedback controller 617 may control the pulse width modulation signal generator 618 through the control signal CS such that the output voltage VOUT is maintained at a target level.

The current detector 620 may include a timing detector 621, a voltage detector 622, and logic 623. A configuration and an operation of the current detector 620 are identical to those described with reference to FIGS. 19 and 20. The current detector 620 may calculate a load current of the voltage converter 610.

In an embodiment, as described with reference to FIGS. 14 to 16, the voltage detector 622 of the device 600 may detect and use the first voltage drop VDR1 from the first switch 611. As described with reference to FIGS. 17 and 18, the voltage detector 622 of the device 600 may detect and use the second voltage drop VDR2 from the second switch 612.

According to the disclosure, a duty timing detector detecting a duty timing of a toggle signal, a device including the duty timing detector, and an operating method of a device receiving the toggle signal are provided. Accordingly, it is possible to verify a toggle signal, and it is possible to easily monitor a device using or receiving the toggle signal.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A device comprising:
 a voltage converter configured to convert a first voltage to a second voltage by using a toggle signal repeatedly transitioning between a high level and a low level and to output the second voltage to a load; and
 a current detector configured to detect a load current transferred from the voltage converter to the load, wherein the current detector includes:
 a duty timing detector configured to activate a detection voltage at a timing when a half of each duty of the toggle signal passes;
 a voltage drop detector configured to detect an internal voltage drop of the voltage converter in response to the detection voltage; and
 logic configured to obtain the load current by performing calculation on the internal voltage drop detected by the voltage drop detector.

2. The device of claim 1, wherein the duty timing detector includes:
 a saw-tooth voltage generator configured to output a saw-tooth voltage in synchronization with the toggle signal;
 a sample circuit configured to obtain a level of the saw-tooth voltage in synchronization with the toggle signal and to output the level as a first sample voltage;
 a hold circuit configured to store the first sample voltage in synchronization with the toggle signal and to output the first sample voltage as a second sample voltage;
 a voltage divider configured to divide the second sample voltage to output a division voltage; and
 a comparator configured to compare the saw-tooth voltage and the division voltage to activate the detection voltage at the timing when the half of each duty of the toggle signal passes.

3. The device of claim 1, wherein:
 the voltage converter includes:
 a first transistor and a second transistor connected in series between a node to which the first voltage is input and a ground node to which a ground voltage is supplied;
 an inductor connected between a node between the first transistor and the second transistor and an output node from which the second voltage is output; and a capacitor connected between the output node and the ground node, and the first transistor is turned on when the toggle signal is at the low level and the second transistor is turned on when the toggle signal is at the high level.

4. The device of claim 3, wherein the voltage drop detector is configured to detect the internal voltage drop from the first transistor or the second transistor at the timing when the half of each duty of the toggle signal passes.

5. The device of claim 4, wherein the logic is configured to calculate the load current by applying a resistance component of the first transistor or the second transistor to the internal voltage drop.

6. The device of claim 4, wherein:

when a duty ratio of the toggle signal is over a first threshold, the logic detects the internal voltage drop from the second transistor, and when the duty ratio of the toggle signal is under a second threshold, the logic detects the internal voltage drop from the first transistor.

7. The device of claim 1, wherein:

the voltage converter includes:

a first transistor and a second transistor connected in series between an output node through which the second voltage is output to the load and a ground node to which a ground voltage is supplied;

an inductor connected between a node between the first transistor and the second transistor and an input node to which the first voltage is input; and a capacitor connected between the output node and the ground node, and the first transistor is turned on when the toggle signal is at the low level and the second transistor is turned on when the toggle signal is at the high level.

8. A waveform timing device comprising:

a timing circuit that generates a first voltage whose value is proportional to a first on-time of a waveform applied to the timing circuit during a first cycle of the waveform comprising the first on-time and a first off-time; and a comparator that compares the first voltage with a reference signal, generated from a second cycle of the waveform, to generate a timing signal indicating whether a predetermined portion of a second on-time of the second cycle of the waveform has expired.

9. The waveform timing device of claim 8, wherein the timing circuit is constituted entirely of analog circuitry.

10. The waveform timing device of claim 8, wherein the first cycle of the waveform immediately precedes the second cycle of the waveform.

11. The waveform timing device of claim 8, wherein the timing circuit comprises an integrator that integrates a constant signal during the first on-time to generate a first integrated signal and integrates the constant signal during the second on-time to generate a second integrated signal.

12. The waveform timing device of claim 11, wherein the integrator integrates the constant signal for a period of the first on-time to generate the first integrated signal.

13. The waveform timing device of claim 11, wherein the constant signal is a current source.

14. The waveform timing device of claim 11, wherein the timing circuit further comprises a sampler that samples the first integrated signal to generate a sampled first integrated signal and samples the second integrated signal to generate a sampled second integrated signal.

15. The waveform timing device of claim 14, wherein the sampler generates the sampled first integrated signal before the integrator completes integrating the constant signal for a period of the first on-time.

16. The waveform timing device of claim 14, wherein the reference signal is either the second integrated signal or the sampled second integrated signal.

17. The waveform timing device of claim 14, wherein the timing circuit further comprises a hold circuit that stores the sampled first integrated signal.

18. The waveform timing device of claim 14, wherein the timing circuit further comprises a voltage divider that generates the first voltage by dividing the sampled first integrated signal by the predetermined portion.

19. The waveform timing device of claim 17, further comprising clocking circuitry that transitions a first signal to enable the sampler to sample the first integrated signal in response to a transition of the waveform from an off-state to an on-state.

20. The waveform timing device of claim 19, wherein the waveform is rectangular and the on-state has a higher/lower voltage than does the off-state.

* * * * *